US012216196B2

(12) United States Patent
Huang et al.

(10) Patent No.: US 12,216,196 B2
(45) Date of Patent: Feb. 4, 2025

(54) METHODS AND APPARATUS FOR PROVIDING A 360-DEGREE FIELD-OF-VIEW RADAR SYSTEM

(71) Applicant: Nuro, Inc., Mountain View, CA (US)

(72) Inventors: Jingqing Huang, San Mateo, CA (US); Peter Jon Kardassakis, Mountain View, CA (US); Zachary Odenheimer, Mountain View, CA (US); Russell Leigh Smith, Mountain View, CA (US)

(73) Assignee: NURO, INC., Mountain View, CA (US)

( * ) Notice: Subject to any disclaimer, the term of this patent is extended or adjusted under 35 U.S.C. 154(b) by 417 days.

(21) Appl. No.: 17/465,059

(22) Filed: Sep. 2, 2021

(65) Prior Publication Data

US 2022/0091255 A1 Mar. 24, 2022

Related U.S. Application Data

(60) Provisional application No. 63/080,071, filed on Sep. 18, 2020.

(51) Int. Cl.
*G01S 13/87* (2006.01)
*G01S 13/931* (2020.01)
*H05K 1/02* (2006.01)

(52) U.S. Cl.
CPC ............ *G01S 13/87* (2013.01); *G01S 13/931* (2013.01); *H05K 1/0243* (2013.01); *G01S 2013/93273* (2020.01); *H05K 2201/10098* (2013.01)

(58) Field of Classification Search
CPC ................. G01S 13/87; G01S 13/931; G01S 2013/93273; G01S 13/42; G01S 17/931;
(Continued)

(56) References Cited

U.S. PATENT DOCUMENTS 9,917,355 B1 * 3/2018 Lee .................. H01Q 21/20
2018/0113210 A1 * 4/2018 Izadian ................ G01S 13/90
(Continued)

FOREIGN PATENT DOCUMENTS

DE 102019211722 B3 * 9/2020

OTHER PUBLICATIONS

International Search Report and Written Opinion for counterpart International Application No. PCT/US2021/048816, mailed Dec. 21, 2021, 13 pages.
(Continued)

*Primary Examiner* — Peter M Bythrow
*Assistant Examiner* — Nazra Nur Waheed
(74) *Attorney, Agent, or Firm* — Edell, Shapiro & Finnan, LLC

(57) ABSTRACT

A plurality of radar units is included in an overall radar module such that the plurality of radar units effectively cooperates to provide an approximately 360-degree field-of-view over a relatively long range. The overall radar module may include a ring-shaped printed circuit board, and a rim that includes multiple radar units positioned to substantially cover a 360-degree field-of-view. Radar units of the overall radar module may be grouped together such that two or more radar units may operate substantially synchronously, e.g., as a substantially single radar unit.

24 Claims, 17 Drawing Sheets

(58) Field of Classification Search
CPC ........ G01S 7/40; G01S 13/867; G01S 13/865;
G01S 13/426; G01S 13/06; G01S 13/90;
G01S 13/003; H05K 1/0243; H05K
2201/10098; B62D 55/06; G01C 21/3415;
H04N 23/69; H04L 7/0054; B60W
30/18163; G06F 16/2228; G05D 1/0088
See application file for complete search history.

(56) References Cited

U.S. PATENT DOCUMENTS

| | | |
|---|---|---|
| 2018/0267160 A1 | 9/2018 | Slemp |
| 2019/0293788 A1 | 9/2019 | Madia |
| 2020/0025898 A1* | 1/2020 | Ain-Kedem ............ G01S 17/58 |
| 2021/0018588 A1* | 1/2021 | Akamine ................ G01S 7/411 |

OTHER PUBLICATIONS

Ahmet Oncu et al., "22-29 GHz Ultra-Wideband CMOS Pulse Generator for Short-Range Radar Applications", IEEE Journal of Solid-State Circuits, vol. 42, No. 7, Jul. 2007, 9 pages.

Shane Murray, "Autonomous Vehicle Radar Perception in 360 Degrees", NVIDIA Developer Blog, Nov. 27, 2019, 7 pages.

* cited by examiner

METHODS AND APPARATUS FOR PROVIDING A 360-DEGREE FIELD-OF-VIEW RADAR SYSTEM

CROSS REFERENCE TO RELATED APPLICATION

This application claims priority to U.S. Provisional Application No. 63/080,071, filed Sep. 18, 2020, the entirety of which is incorporated herein by reference.

TECHNICAL FIELD

The disclosure relates to autonomous vehicles. More particularly, the disclosure relates to providing sensors for use in autonomous vehicles.

BACKGROUND

Autonomous vehicles typically use multiple sensors to ensure that the autonomous vehicles may operate safely and reliably. For example, most autonomous vehicles utilize sensors such as cameras, lidar units, and radar units. The ability for such sensors to efficiently provide a full 360-degree field-of-view increases the likelihood that the autonomous vehicles are able to operate safely and reliably.

BRIEF DESCRIPTION OF THE DRAWINGS

The disclosure will be readily understood by the following detailed description in conjunction with the accompanying drawings in which.

DESCRIPTION OF EXAMPLE EMBODIMENTS

General Overview

Figure 1:
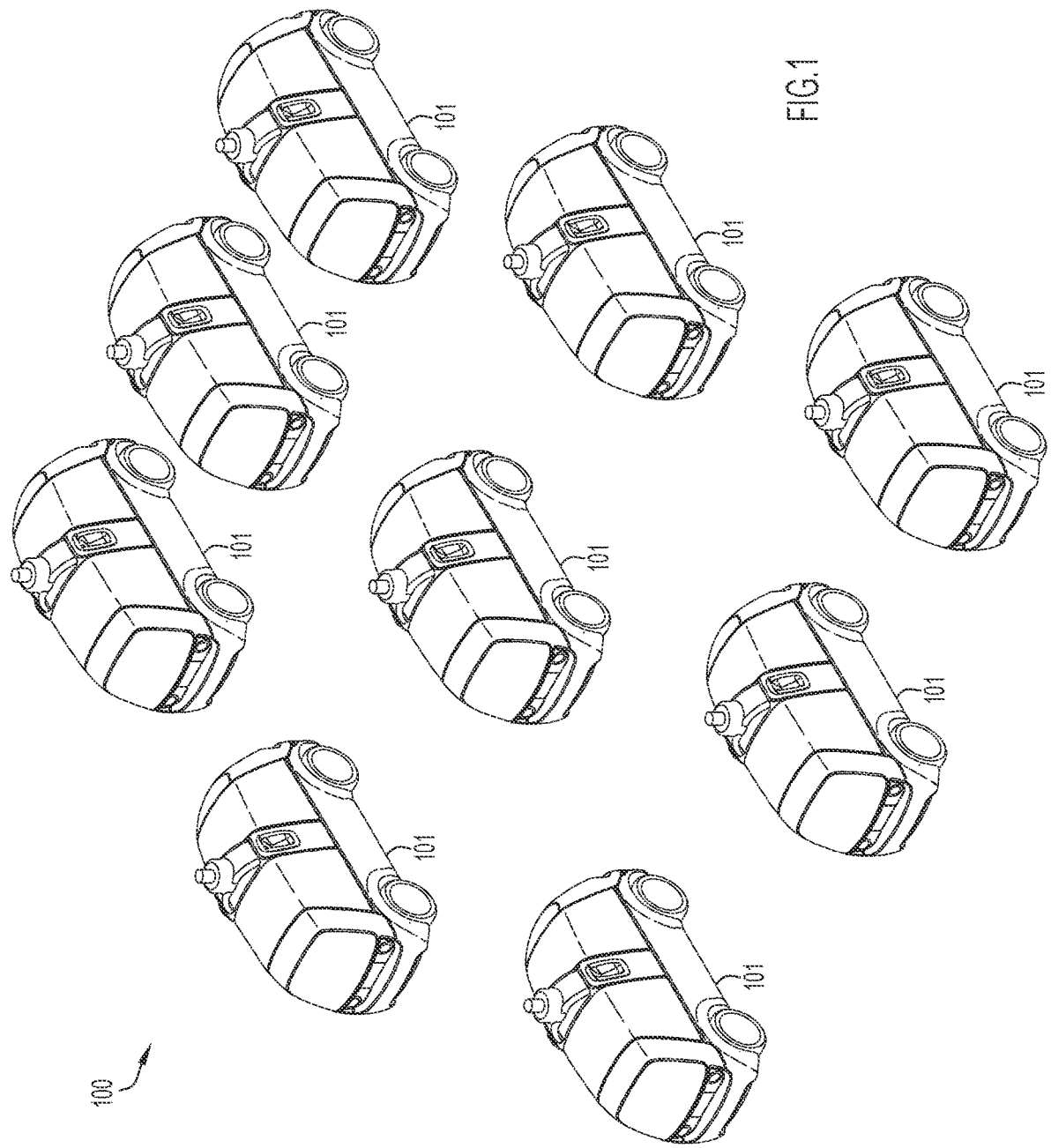
FIG. 1 is a diagrammatic representation of an autonomous vehicle fleet in accordance with an embodiment.

In one embodiment, a plurality of radar units is included in an overall radar module such that the plurality of radar units effectively cooperates to provide an approximately 360-degree field-of-view over a relatively long range. The overall radar module may include a ring-shaped printed circuit board, and a rim that includes multiple radar units positioned to substantially cover a 360-degree field-of-view. Radar units of the overall radar module may be grouped together such that two or more radar units may operate substantially synchronously, e.g., as a substantially single radar unit.

Description

Sensor systems such as camera systems, lidar systems, and radar systems are often used in autonomous vehicles to provide information relating to the environment around the autonomous vehicles. For example, sensor systems on an autonomous vehicle may provide information relating to objects such as vehicles or pedestrians in the vicinity of the autonomous vehicle. Such information may generally include a size and shape of an object, as well as the distance to an object and the speed at which the object may be moving.

The ability for a radar module or system to provide an approximately 360-degree field-of-view around a vehicle enables the radar system to provide a substantially complete view of the environment surrounding the vehicle. It should be appreciated that the field-of-view may effectively be a sensing field within which the radar system may sense or otherwise identify objects or targets.

In one embodiment, a radar system may include multiple radar units which are configured in a circular or ring-like pattern such that the multiple radar units cooperate to provide an approximately 360-degree field-of view. By configuring multiple radar units in a ring-like pattern, illumination patterns associated with the multiple radar units may be made cooperate, e.g., substantially overlap, to create an overall illumination pattern which effectively provides an approximately 360-degree field-of-view. As a result, a range of illumination provided by a radar system that includes the multiple radar units may be operationally sufficient even at substantially worst-case locations.

In one embodiment, a radar system may include approximately nine radar units which may substantially be spaced apart from each other such that centerlines of adjacent radar units are effectively separated by approximately forty degrees. The radar units may each have an associated power amplifier configured to allow each radar unit to have an illumination range of over approximately two hundred meters. In one embodiment, radar units may be grouped, e.g., paired, together such that two or more radar units of a radar system may perform detection in synchronization for improved detection and radar imaging.

An autonomous vehicle which includes a radar system that includes multiple radar units arranged in a ring-like pattern may be part of an autonomous vehicle fleet. However, it is to be understood that the radar system and related methods presented herein are not limited to any particular type of vehicle or to autonomous vehicles; they may have many uses on human-driven vehicles as well.

Referring initially to FIG. 1, an autonomous vehicle fleet will be described in accordance with an embodiment. An autonomous vehicle fleet 100 includes a plurality of autonomous vehicles 101, or robot vehicles. Autonomous vehicles 101 are generally arranged to transport and/or to deliver cargo, items, and/or goods. Autonomous vehicles 101 may be fully autonomous and/or semi-autonomous vehicles. In general, each autonomous vehicle 101 may be a vehicle that is capable of traveling in a controlled manner for a period of time without intervention, e.g., without human intervention. As will be discussed in more detail below, each autonomous vehicle 101 may include a power system, a propulsion or conveyance system, a navigation module, a control system or controller, a communications system, a processor, and a sensor system.

Dispatching of autonomous vehicles 101 in autonomous vehicle fleet 100 may be coordinated by a fleet management module (not shown). The fleet management module may dispatch autonomous vehicles 101 for purposes of transporting, delivering, and/or retrieving goods or services in an unstructured open environment or a closed environment.

Figure 2:
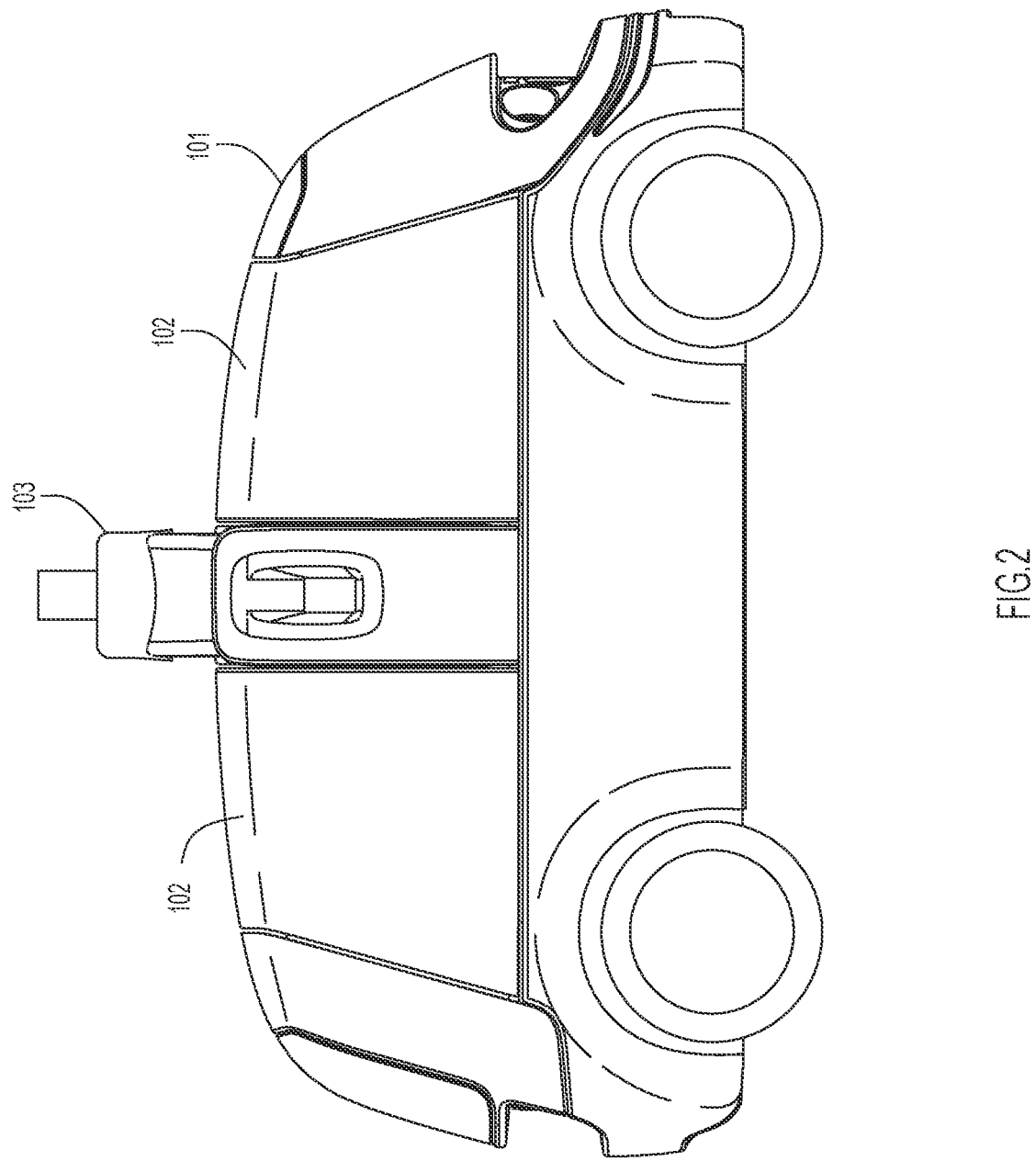
FIG. 2 is a diagrammatic representation of a side of an autonomous vehicle in accordance with an embodiment.

FIG. 2 is a diagrammatic representation of a side of an autonomous vehicle, e.g., one of autonomous vehicles 101 of FIG. 1, in accordance with an embodiment. Autonomous vehicle 101, as shown, is a vehicle configured for land travel. Typically, autonomous vehicle 101 includes physical vehicle components such as a body or a chassis, as well as conveyance mechanisms, e.g., wheels. In one embodiment, autonomous vehicle 101 may be relatively narrow, e.g., approximately two to approximately five feet wide, and may have a relatively low mass and relatively low center of gravity for stability. Autonomous vehicle 101 may be arranged to have a working speed or velocity range of between approximately one and approximately forty-five miles per hour (mph), e.g., approximately twenty-five miles per hour. In some embodiments, autonomous vehicle 101 may have a substantially maximum speed or velocity in range between approximately thirty and approximately ninety mph.

Autonomous vehicle 101 includes a plurality of compartments 102. Compartments 102 may be assigned to one or more entities, such as one or more customer, retailers, and/or vendors. Compartments 102 are generally arranged to contain cargo, items, and/or goods. Typically, compartments 102 may be secure compartments. It should be appreciated that the number of compartments 102 may vary. That is, although two compartments 102 are shown, autonomous vehicle 101 is not limited to including two compartments 102.

Autonomous vehicle 101 also includes multiple sensors, at least some of which are included in a sensor stack 103. Sensor stack 103 may include, but is not limited to including, sensors such as at least one camera, at least one lidar system, and/or at least one radar system.

Figure 3:
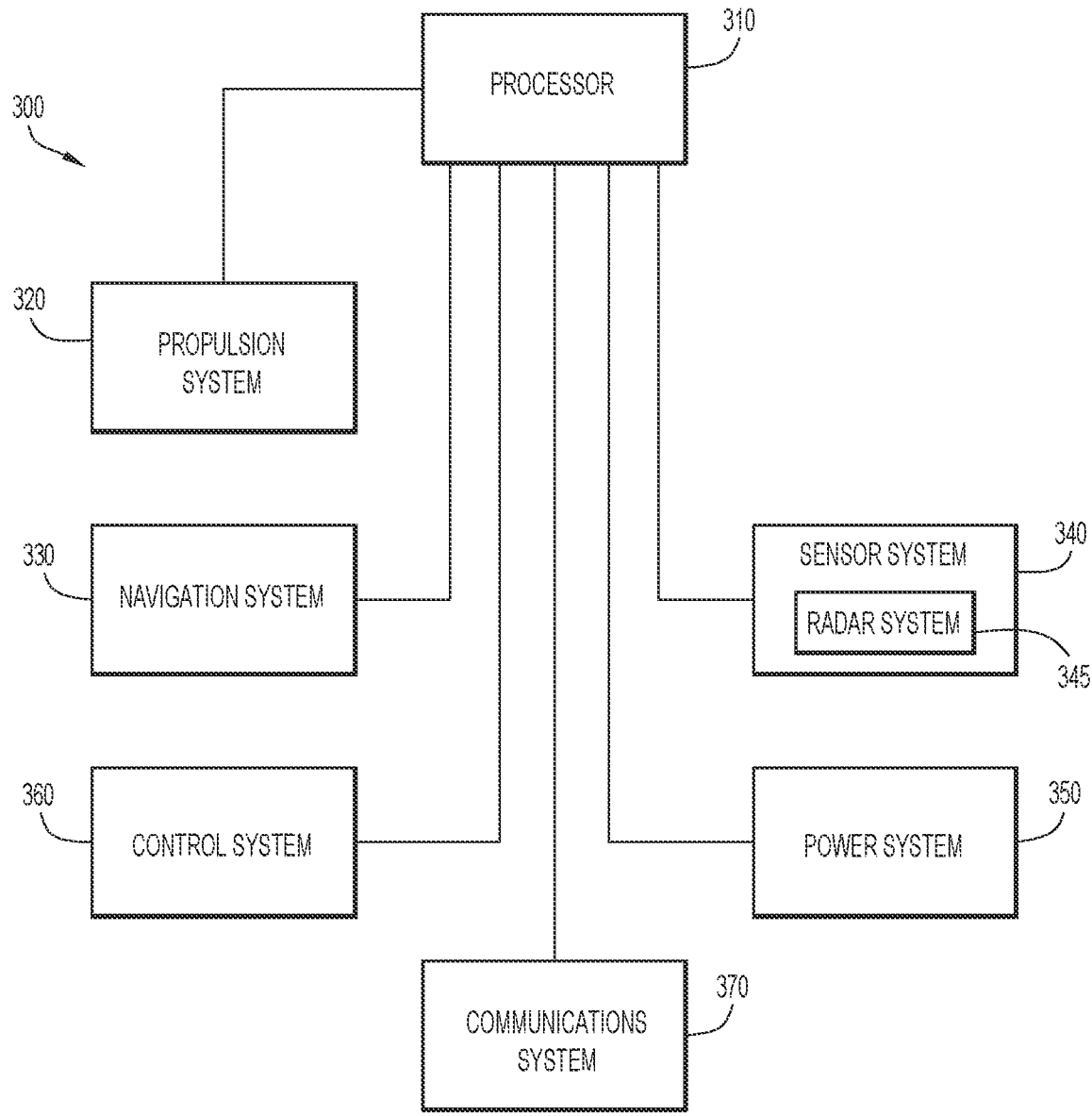
FIG. 3 is a block diagram representation of an autonomous vehicle in accordance with an embodiment.

FIG. 3 is a block diagram representation of system components 300 an autonomous vehicle, e.g., autonomous vehicle 101 of FIG. 1, in accordance with an embodiment. The system components 300 include a processor 310, a propulsion system 320, a navigation system 330, a sensor system 340 that includes a radar system 345, a power system 350, a control system 360, and a communications system 370. It should be appreciated that processor 310, propulsion system 320, navigation system 330, sensor system 340, power system 350, and control system 360 may be coupled/mounted to a chassis or body of autonomous vehicle 101.

Processor 310 is arranged to send instructions to and to receive instructions from or for various components such as propulsion system 320, navigation system 330, sensor system 340, power system 350, and control system 360. Propulsion system 320 is a conveyance system is arranged to cause autonomous vehicle 101 to move, e.g., drive. For example, when autonomous vehicle 101 is configured with a multi-wheeled automotive configuration as well as steering, braking systems and an engine, propulsion system 320 may be arranged to cause the engine, wheels, steering, and braking systems to cooperate to drive. In general, propulsion system 320 may be configured as a drive system with a propulsion engine, wheels, treads, wings, rotors, blowers, rockets, propellers, brakes, etc. The propulsion engine may be a gas engine, a turbine engine, an electric motor, and/or a hybrid gas and electric engine.

Navigation system 330 may control propulsion system 320 to navigate autonomous vehicle 101 through paths and/or within unstructured open or closed environments. Navigation system 330 may include at least one of digital maps, street view photographs, and a global positioning system (GPS) point. Maps, for example, may be utilized in cooperation with sensors included in sensor system 340 to allow navigation system 330 to cause autonomous vehicle 101 to navigate through an environment.

Sensor system 340 includes any sensors, as for example LiDAR, radar, ultrasonic sensors, microphones, altimeters, and/or cameras. Sensor system 340 generally includes onboard sensors which allow autonomous vehicle 101 to safely navigate, and to ascertain when there are objects near autonomous vehicle 101. In one embodiment, sensor system 340 may include propulsion systems sensors that monitor drive mechanism performance, drive train performance, and/or power system levels. As shown, sensor system 340 includes the radar system 345 which is capable of providing an approximately 360-degree field-of-view. Radar system 345 may include multiple radar units, e.g., approximately nine radar units, for example.

Power system 350 is arranged to provide power to autonomous vehicle 101. Power may be provided as electrical power, gas power, or any other suitable power, e.g., solar power or battery power. In one embodiment, power system 350 may include a main power source, and an auxiliary power source that may serve to power various components of autonomous vehicle 101 and/or to generally provide power to autonomous vehicle 101 when the main power source does not does not have the capacity to provide sufficient power.

Communications system 370 allows autonomous vehicle 101 to communicate, as for example, wirelessly, with a fleet management system (not shown) that allows autonomous vehicle 101 to be controlled remotely. Communications system 370 generally obtains or receives data, stores the data, and transmits or provides the data to a fleet management system and/or to autonomous vehicles 101 within a fleet 100. The data may include, but is not limited to including, information relating to scheduled requests or orders, information relating to on-demand requests or orders, and/or information relating to a need for autonomous vehicle 101 to reposition itself, e.g., in response to an anticipated demand.

In some embodiments, control system 360 may cooperate with processor 310 to determine where autonomous vehicle 101 may safely travel, and to determine the presence of objects in a vicinity around autonomous vehicle 101 based on data, e.g., results, from sensor system 340. In other words, control system 360 may cooperate with processor 310 to effectively determine what autonomous vehicle 101 may do (e.g., how it can safely move about) within its immediate surroundings. Control system 360 in cooperation with processor 310 may essentially control power system 350 and navigation system 330 as part of driving or conveying autonomous vehicle 101. Additionally, control system 360 may cooperate with processor 310 and communications system 370 to provide data to or obtain data from other autonomous vehicles 101, a management server, a global positioning server (GPS), a personal computer, a teleoperations system, a smartphone, or any computing device via the communications system 370. In general, control system 360 may cooperate at least with processor 310, propulsion system 320, navigation system 330, sensor system 340, and power system 350 to allow vehicle 101 to operate autonomously. That is, autonomous vehicle 101 is able to operate autonomously through the use of an autonomy system that effectively includes, at least in part, functionality provided by propulsion system 320, navigation system 330, sensor system 340, power system 350, and control system 360.

As will be appreciated by those skilled in the art, when autonomous vehicle 101 operates autonomously, vehicle 101 may generally operate, e.g., drive, under the control of an autonomy system. That is, when autonomous vehicle 101 is in an autonomous mode, autonomous vehicle 101 is able to generally operate without a driver or a remote operator controlling autonomous vehicle. In one embodiment, autonomous vehicle 101 may operate in a semi-autonomous mode or a fully autonomous mode. When autonomous vehicle 101 operates in a semi-autonomous mode, autonomous vehicle 101 may operate autonomously at times and may operate under the control of a driver or a remote operator at other times. When autonomous vehicle 101 operates in a fully autonomous mode, autonomous vehicle 101 typically operates substantially only under the control of an autonomy system. The ability of an autonomous system to collect information and extract relevant knowledge from the environment provides autonomous vehicle 101 with perception capabilities. For example, data or information obtained from sensor system 340 may be processed such that the environment around autonomous vehicle 101 may effectively be perceived.

Figure 4:
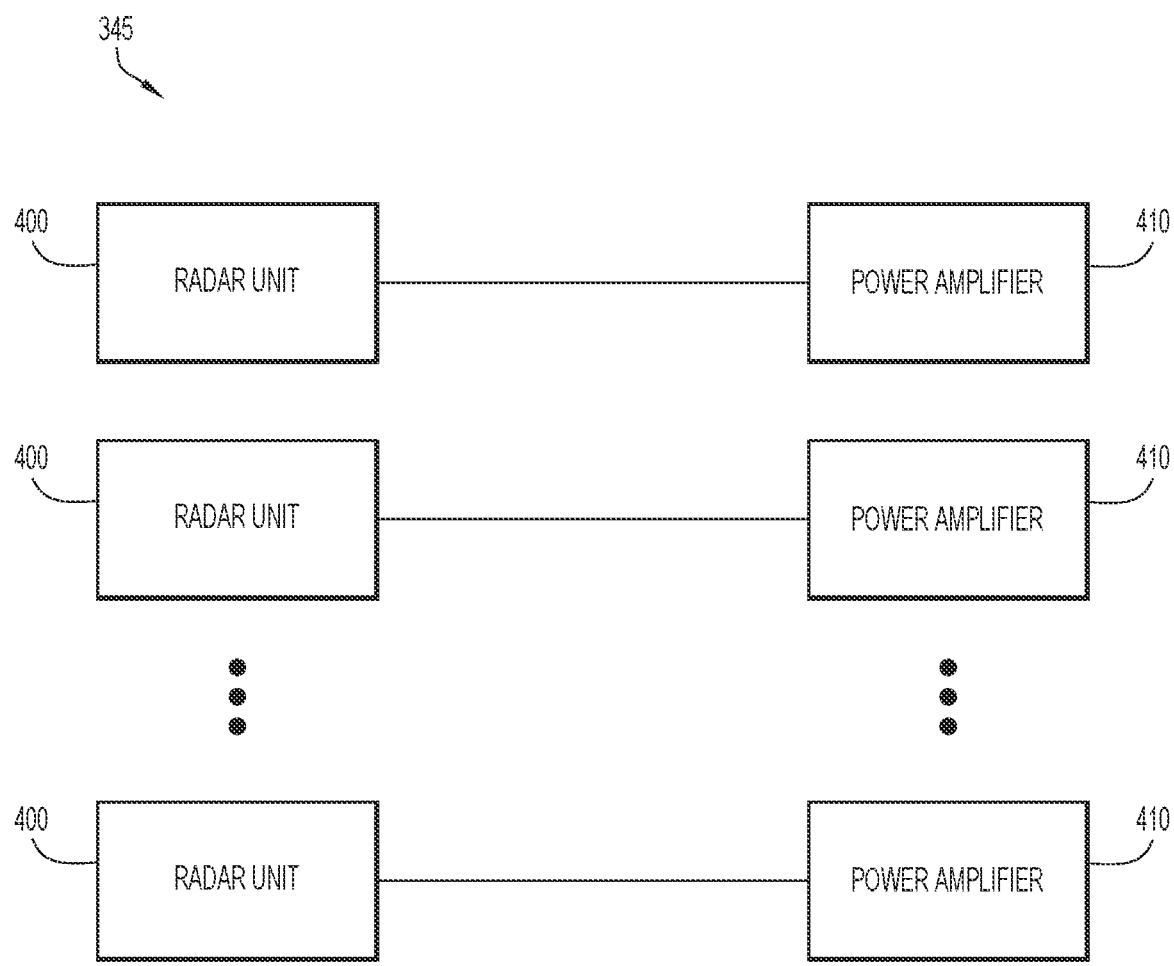
FIG. 4 is a block diagram representation of a radar system, e.g., radar system 345 of FIG. 3, in accordance with an embodiment.
Figure 5:
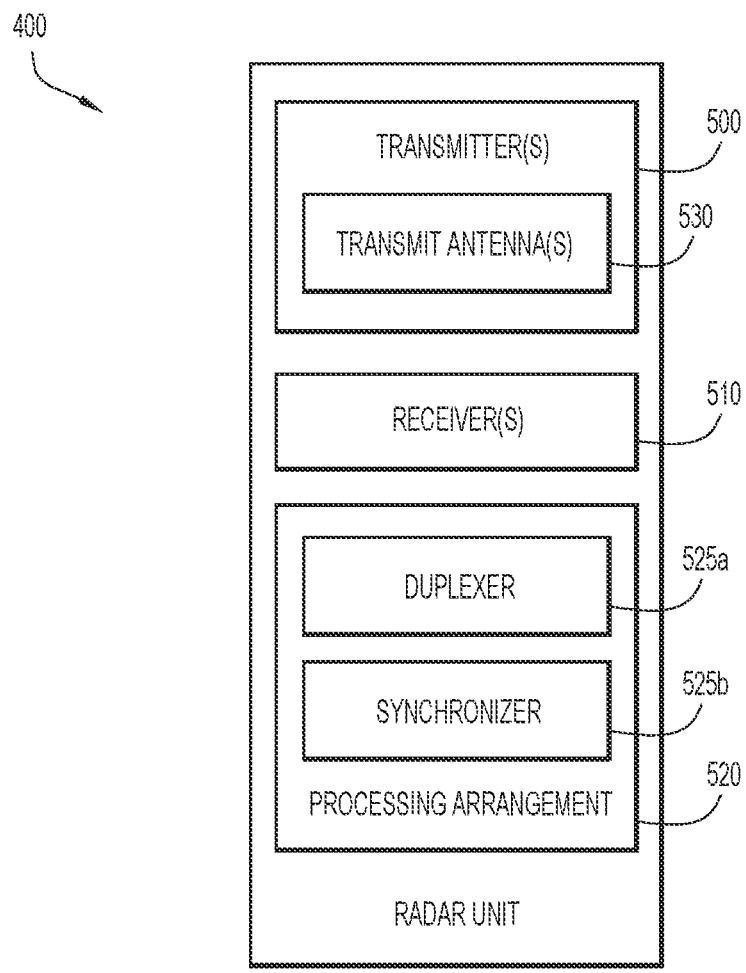
FIG. 5 is a block diagram representation of a radar unit, e.g., radar unit 400 of FIG. 4, in accordance with an embodiment.

With reference to FIG. 4, radar system 345 will be described in accordance with an embodiment. Radar system 345 may generally include multiple radar units 400 and multiple power amplifiers 410. Radar units 400, which will be discussed below with reference to FIG. 5, are each coupled to an associated power amplifier 410 configured to effectively adjust (decrease or boost or otherwise increase) the power of radar units 400. In one embodiment, radar system 345 includes approximately nine radar units 400 and approximately nine power amplifiers 410. It should be appreciated that the number of radar units 400 and/or power amplifiers 410 may vary widely. In some instances, radar units 400 may effectively share power amplifiers 410 such that a single power amplifier 410 may be used to amplify the output of more than one radar unit 400.

Referring next to FIG. 5, radar unit 400 will be described in accordance with an embodiment. Radar unit 400, which is suited for use to support the autonomous operations of an autonomous vehicle such as vehicle 101 of FIGS. 2 and 3, includes at least one transmitter 500, at least one receiver 510, and at least one processing arrangement 520.

Transmitter 500, which may apply a signal or waves to one or more transmit antennas 530, is configured to transmit radio waves, as for example waves in an approximately twenty-four GHz band and/or in an approximately seventy-seven GHz band. The number of transmit antennas 530 associated with transmitter 500 may vary widely. In the described embodiment, transmitter 500 may include approximately three transmit antennas 530.

Receiver 510, which may utilize transmit antennas 530 or other antennas (not shown) that detect a signal or waves which have reflected off of the surface of an object (not shown), converts the detected reflected signal or waves and converts them to receive signals for processing. Processing arrangement 520 includes hardware and/or software, and is generally arranged to process receive signals produced by the receiver 510 in order to identify where an object (not shown) is located, how far away the object is from radar unit 400 or radar system 345, a direction in which the object is moving, and/or how fast the object is moving. In one embodiment, processing arrangement 520 includes a duplexer 525*a* and a synchronizer 525*b*. Duplexer 525*a* enables transmitter 500 and receiver 510 to substantially share antennas 540 for transmitting and receiving purposes. Synchronizer 525*b* is configured to substantially control and provide timing associated with the operations of radar system radar unit 400.

There are various implementation variations that are envisioned. For example, three transmitters and three receivers (with associated antennas) may be deployed on the same printed circuit board.

Figure 6:
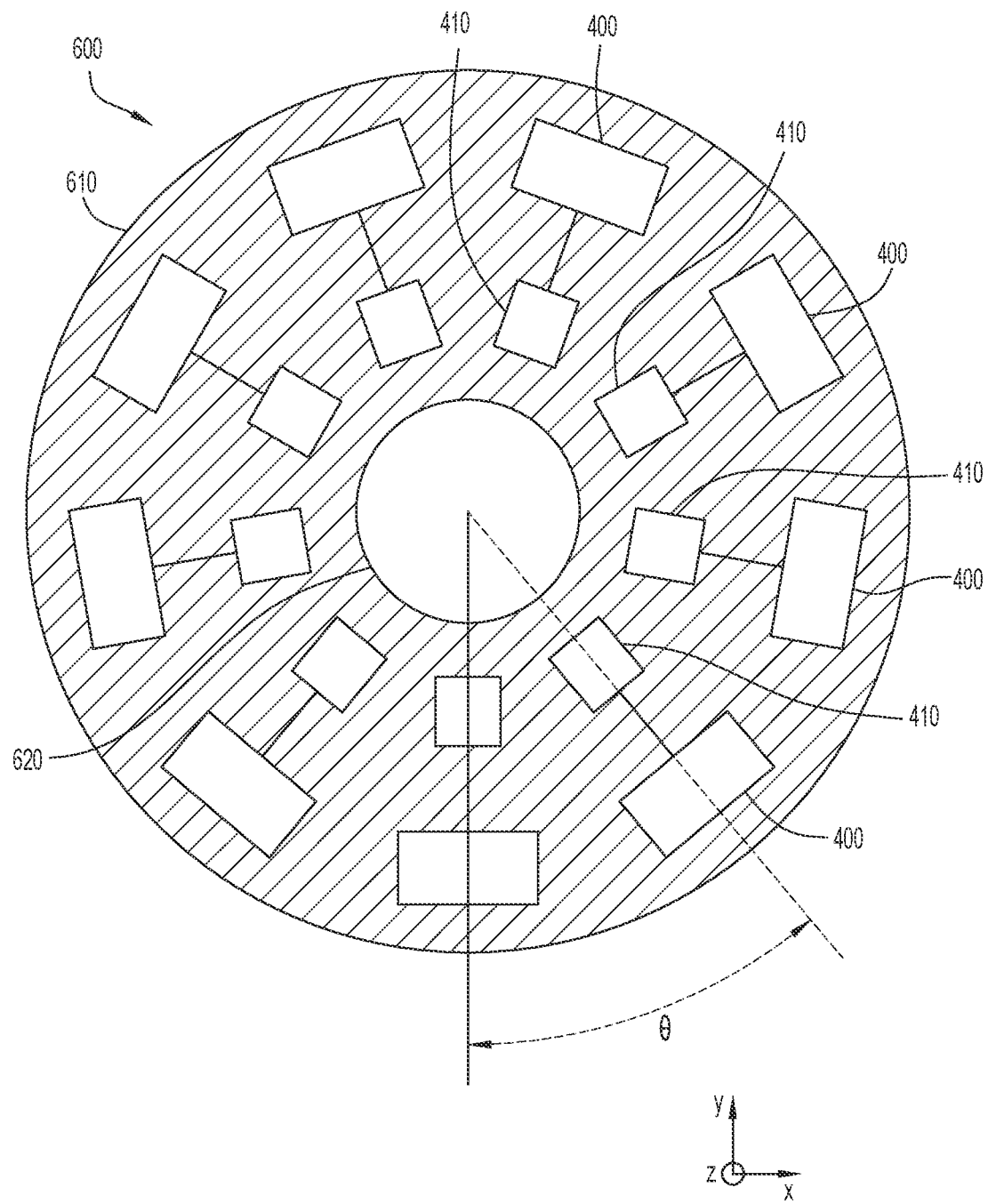
FIG. 6 is a diagrammatic cross-sectional top-view representation of a radar system e.g., radar system of FIG. 3, in accordance with an embodiment.

As explained above, one aspect of the embodiments presented herein is to provide a radar system, within an integrated unit, that can provide up to a 360-degree field-of-view, all around a vehicle. A radar system may include multiple radar units that are arranged in a ring-like orientation. Such a radar system may include a housing within which the multiple radar units are positioned. FIG. 6 is a diagrammatic cross-sectional top-view representation of a radar system 600, which includes radar units that are arranged in a substantially circular or ring-like orientation in accordance with an embodiment.

Radar system 600 includes a printed circuit board 610 which may include circuitry and/or integrated circuits (not shown) configured to support the operation of radar units 400 and power amplifiers 410 that are coupled to respective radar units 400 such that power amplifiers 410 may adjust (increase or decrease) the detection range associated with radar units 400. In one embodiment, power amplifiers 410 may cooperate with radar units 400 such that each radar unit 400 may have a detection range of more than approximately two hundred meters. The plurality of radar units 400 may be positioned in a substantially circular arrangement with antennas of respective radar units being positioned at substantially evenly spaced angles in the substantially circular arrangement.

Centerlines of substantially adjacent radar units 400 may be separated by an angle θ. In one example embodiment, approximately nine radar units 400 may be arranged such that angle θ is approximately forty degrees.

As shown in FIG. 6, the printed circuit board 610 may have a donut shape (e.g., it is ring-shaped) with a central opening 620. The central opening 620 provides a pathway for airflow to facilitate air circulation around the radar units 400 to efficiently cool all of the radar units 400 and power amplifiers 410 around the ring (at the same time) during operation. In addition, the central opening 620 provides space for routing cables or structures, enabling packaging of other sensors or systems above or below the printed circuit board 610.

The arrangement of the radar system 600 allows for obtaining up to a 360-degree field-of-view as well as achieving the longest range that the radar units 400 can achieve. Moreover, the architecture depicted in FIG. 6 facilitates efficiently obtaining the radar data from multiple radar units deployed all on one printed circuit board.

In addition, as will be described in more detail below, a subset of the radar units 400 may be operated together as a single virtual or overall radar unit to achieve more functionality. The grouping of the two or more radar units 400 can be used to obtain a field-of-view less than a 360-degree field-of-view.

Figure 7:
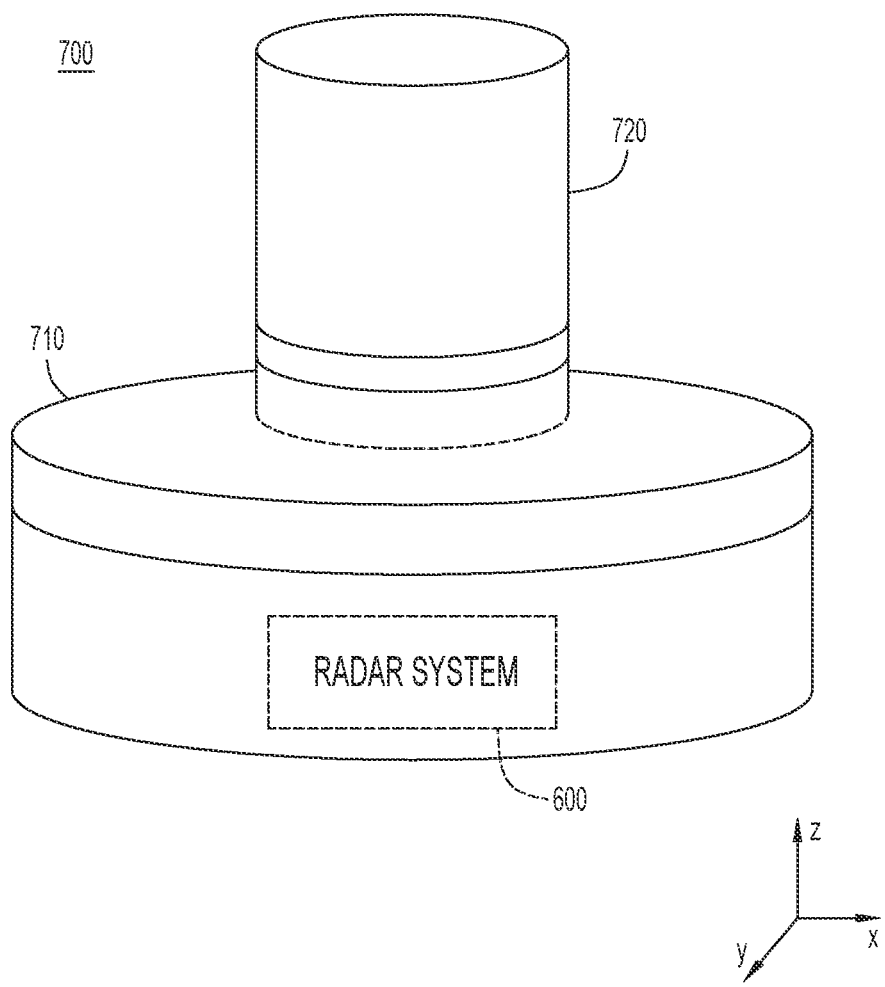
FIG. 7 is a diagrammatic representation of a sensor stack which includes a radar system e.g., radar system of FIG. 3, in accordance with an embodiment.

Radar system or module 600 may be part of a sensor stack mounted on an autonomous vehicle. FIG. 7 is a diagrammatic representation of a sensor stack 700 (corresponding to sensor stack 103 shown in FIG. 2) which includes radar system 600 in accordance with an embodiment. The sensor stack 700 may also include various other sensors used by an autonomous vehicle such as vehicle 101 of FIGS. 2 and 3. The sensor stack 700 includes a generally circular lower housing 710 within which the radar system 600 is deployed, and a cylindrical upper housing 720 within which other sensors may be housed. In general, radar system 600 is a long-range radar module.

Figure 8:
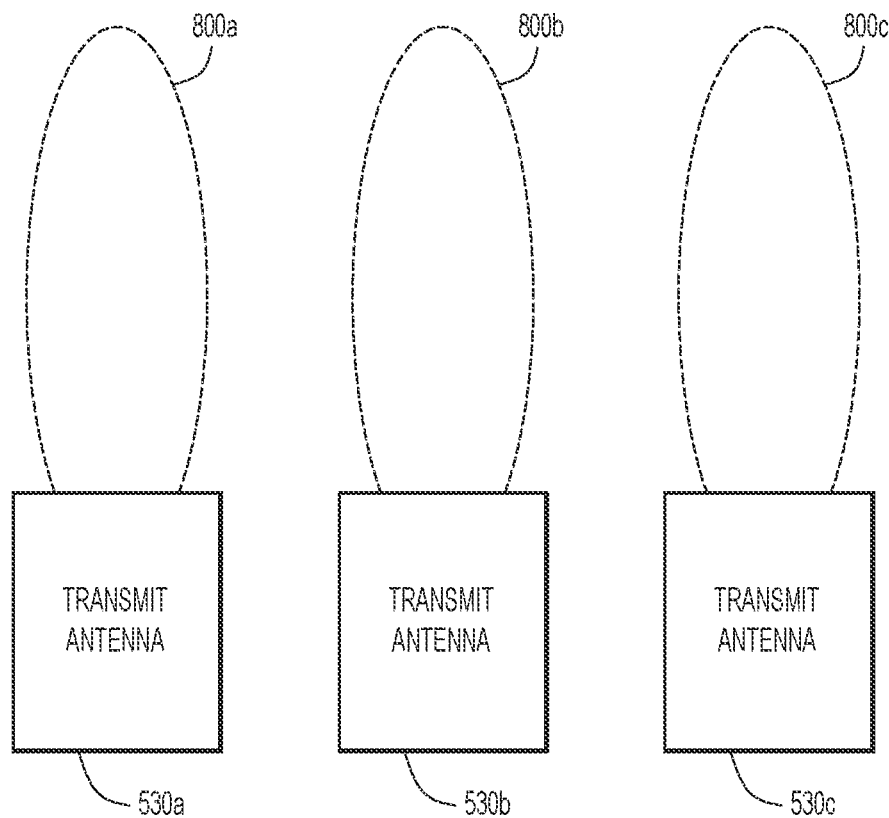
FIG. 8 is a diagrammatic representation of illumination patterns from transmit antennas of a radar unit in accordance with an embodiment.

Transmit antennas that are included in radar units of a radar system may generally be used to effectively illuminate at least a portion of a field-of-view or a sensing field. FIG. 8 is a diagrammatic representation of illumination patterns from transmit antennas of a radar unit in accordance with an embodiment. For example, transmit antennas 530*a*, 530*b*, and 530*c* each have an associated illumination pattern 800*a*, 800*b* and 800*c* that arises when transmit antennas 530*a*, 530*b*, and 530*c* transmit radar signals (illumination signals) for detection of objects in space. Illumination patterns 800*a*-800*c* may be substantially lobe-shaped.

Each radar unit, e.g., radar unit 400 of FIG. 4, may include three transmit antennas and, therefore, may have three illumination patterns or illumination lobes. For a radar system such as radar system 345 of FIGS. 3 and 4 which includes multiple radar units, the number of total illumination patterns associated with the radar system may vary depending upon the number of radar units included in the radar system. In one embodiment, when radar system 345 includes approximately nine radar units, radar system 345 may have approximately twenty-seven substantially separate illumination lobes. It should be appreciated that illumination lobes associated with substantially adjacent radar units may overlap and, as a result, provide a relatively strong sensing range at substantially every location within an approximately 360-degree field-of-view and at up to approximately two hundred meters or more.

Figure 9:
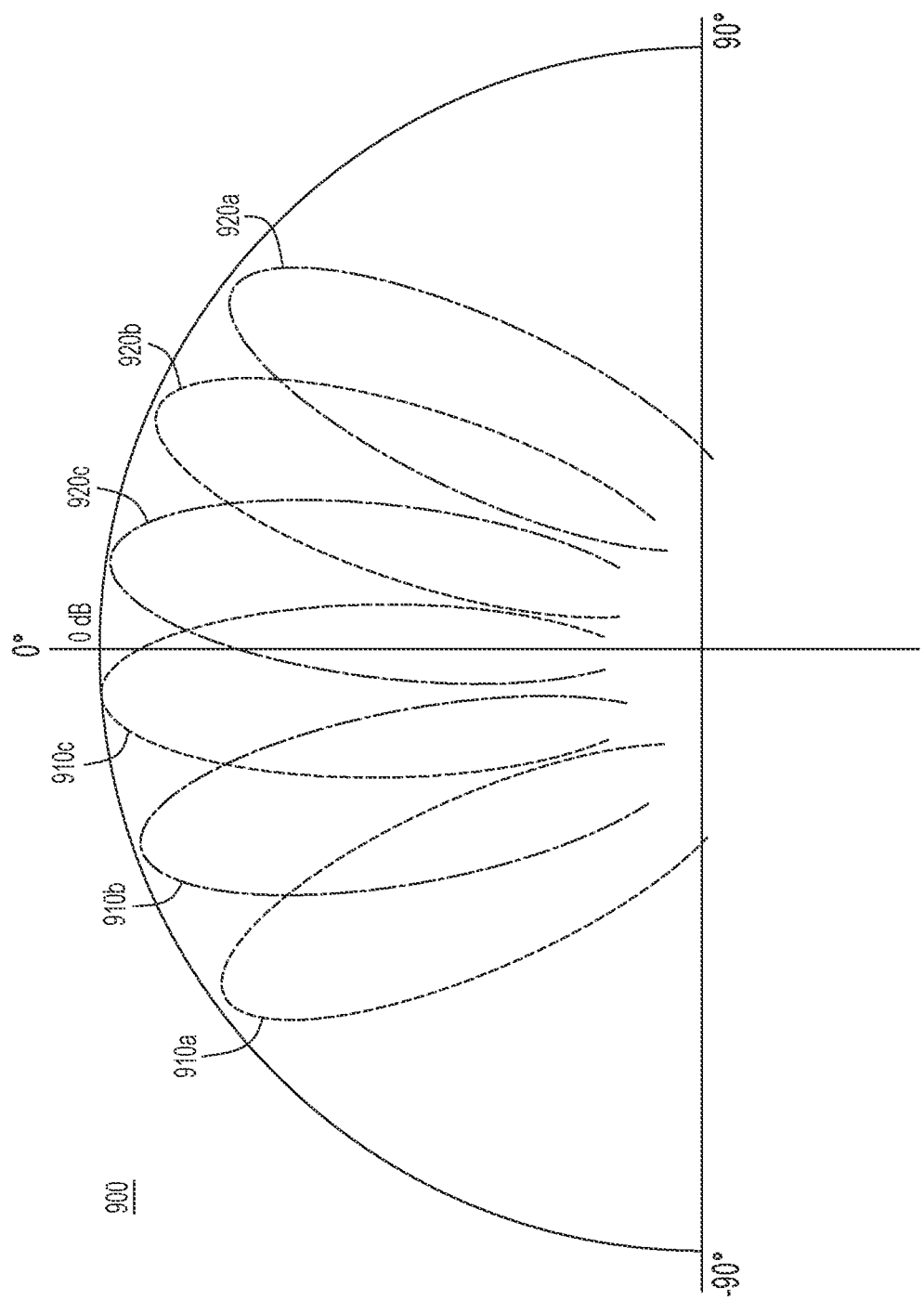
FIG. 9 is a diagrammatic representation of an overall illumination pattern that includes overlap of illumination from transmit antennas of different radar units arranged as part of a ring-like pattern in accordance with an embodiment.

FIG. 9 is a diagrammatic representation of a portion of an overall illumination pattern 900 that includes overlap of illumination from transmit antennas of different radar units arranged as part of a ring-like pattern in accordance with an embodiment. Illumination lobes 910*a*, 910*b* and 910*c* are provided by transmit antennas of a first radar unit (not shown.) Illumination lobes 920*a*, 920*b* and 920*c* are provided by transmit antennas or at least a second radar unit (not shown) that is adjacent to the first radar unit. It should be appreciated that illumination lobes 910*a*-*c* and 920*a*-*c* are not illustrated to scale.

As shown, adjacent illumination lobes associated with different radar units, e.g., illumination lobe 910*a* and illumination lobe 910*b*, may at least partially overlap. The presence of such overlap may improve the coverage of the overall field-of-view of a radar system within a particular range such that few locations within the particular range are not well-covered by illumination or transmitted signals. Nevertheless, a goal of the design of the radar units is to minimize the gap in coverage areas between adjacent lobes so as to still achieve a desired performance.

Radar units included in a radar system may be arranged to cooperate to substantially enhance improved detection and/or radar imaging. In one embodiment, groups of radar units included in a radar system may be substantially triggered to operate together in a synchronous manner. For example, adjacent radar units may effectively be grouped together to operate in synchronization as a single overall or virtual radar unit, as described above. Alternatively, radar units that are not adjacent to each other may effectively be grouped together to perform in synchronization as a substantially single overall radar unit to compare and/or to refine velocity and location information about an object or a target.

Figure 10A:
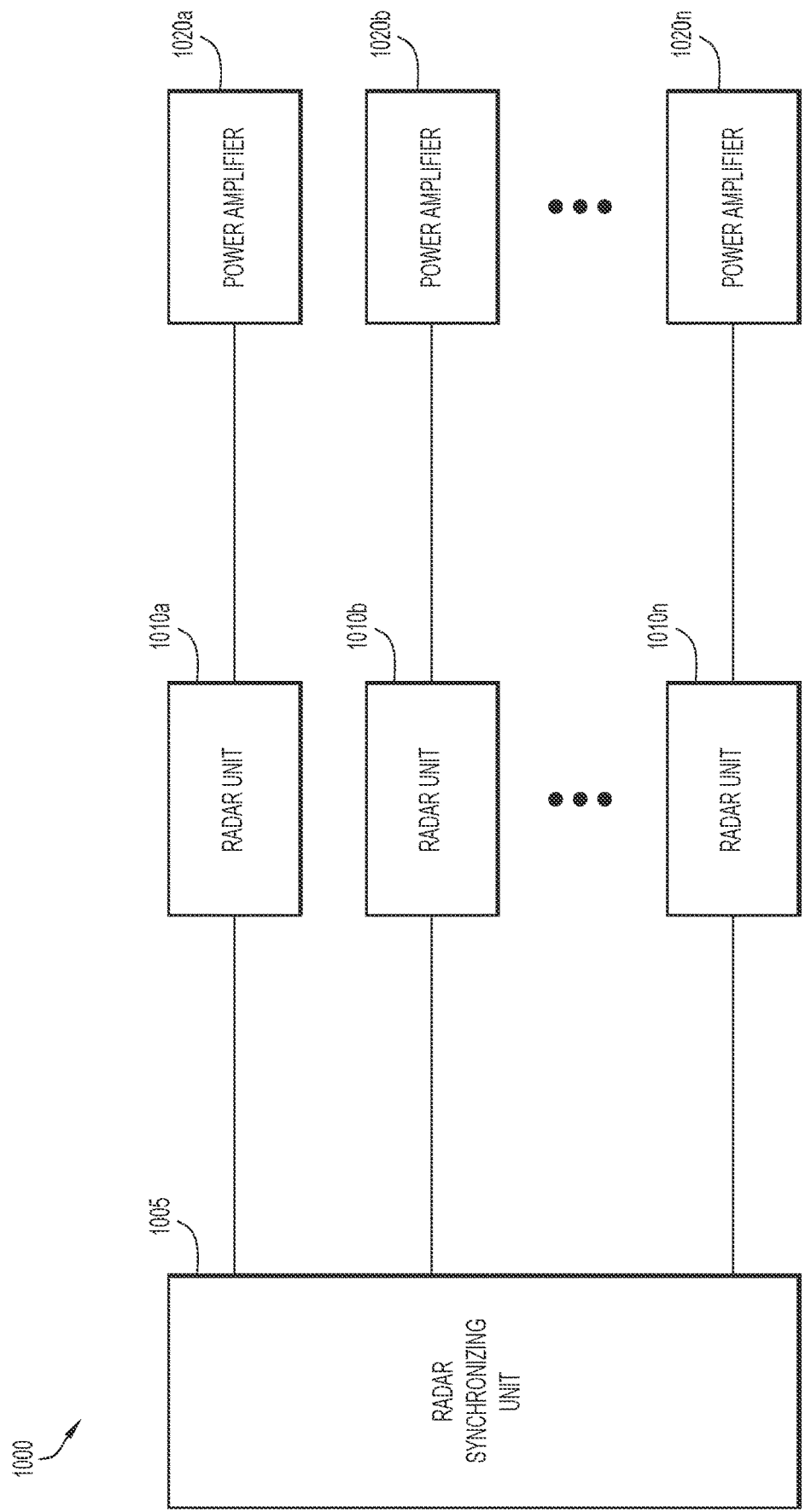
FIG. 10A is a block diagram representation of a radar system, e.g., radar system of FIG. 3, that includes a radar synchronizing unit in accordance with an embodiment.

FIG. 10A is a block diagram representation of a radar system 1000, e.g., radar system of FIG. 3, which includes a radar synchronizing unit 1005 in accordance with an embodiment. Radar system 1000 may generally include multiple radar units 1010*a*-*n* and multiple power amplifiers 1020*a*-*n*. In one embodiment, radar system 1000 may include approximately nine radar units 1010*a*-*n* and approximately nine power amplifiers 1020*a*-*n*, although it should be appreciated that the number of radar units 1010*a*-*n* and power amplifiers 1020*a*-*n* may vary. Radar units 1010*a*-*n* are coupled to respective power amplifiers 1020*a*-*n* which are arranged to adjust (e.g., boost or increase, or reduce) the power of radar units 1010*a*-*n* such that the transmission ranges and/or detection ranges associated with radar units 1010*a*-*n* may be adjusted (enhanced or reduced) accordingly.

Radar system 1000 also includes radar synchronizing unit 1005 (also referred to herein as a radar synchronizing controller), which includes hardware and/or software configured to effectively trigger more than one radar unit 1010*a*-*n* at substantially the same time, e.g., synchronously, such that more than one radar until 1010*a*-*n* may operate together as a substantially single overall or virtual radar unit. Radar synchronizing unit 1005 may also be configured to determine which radar units 1010*a*-*n* to include in a particular single overall radar unit, as well as to process data received from radar units 1010*a*-*n* included in the particular single overall or virtual radar unit, e.g., to compare and/or to refine the resolution of velocity and/or location information relating to a sensed object or target. Operating multiple radar units together in this manner may improve resolution, which means resolvability is improved to better distinguish two targets that may be close together.

In one embodiment, radar synchronizing unit 1005 may configure a number of radar units 1010a-n to operate synchronously, or in sync, at runtime such that detection performance may be increased as needed. That is, the number of radar units 1010a-n which operate together substantially synchronously may be varied at runtime or in real-time to vary detection performance, e.g., to improve detection performance, as substantially as deemed necessary.

Figure 10B:
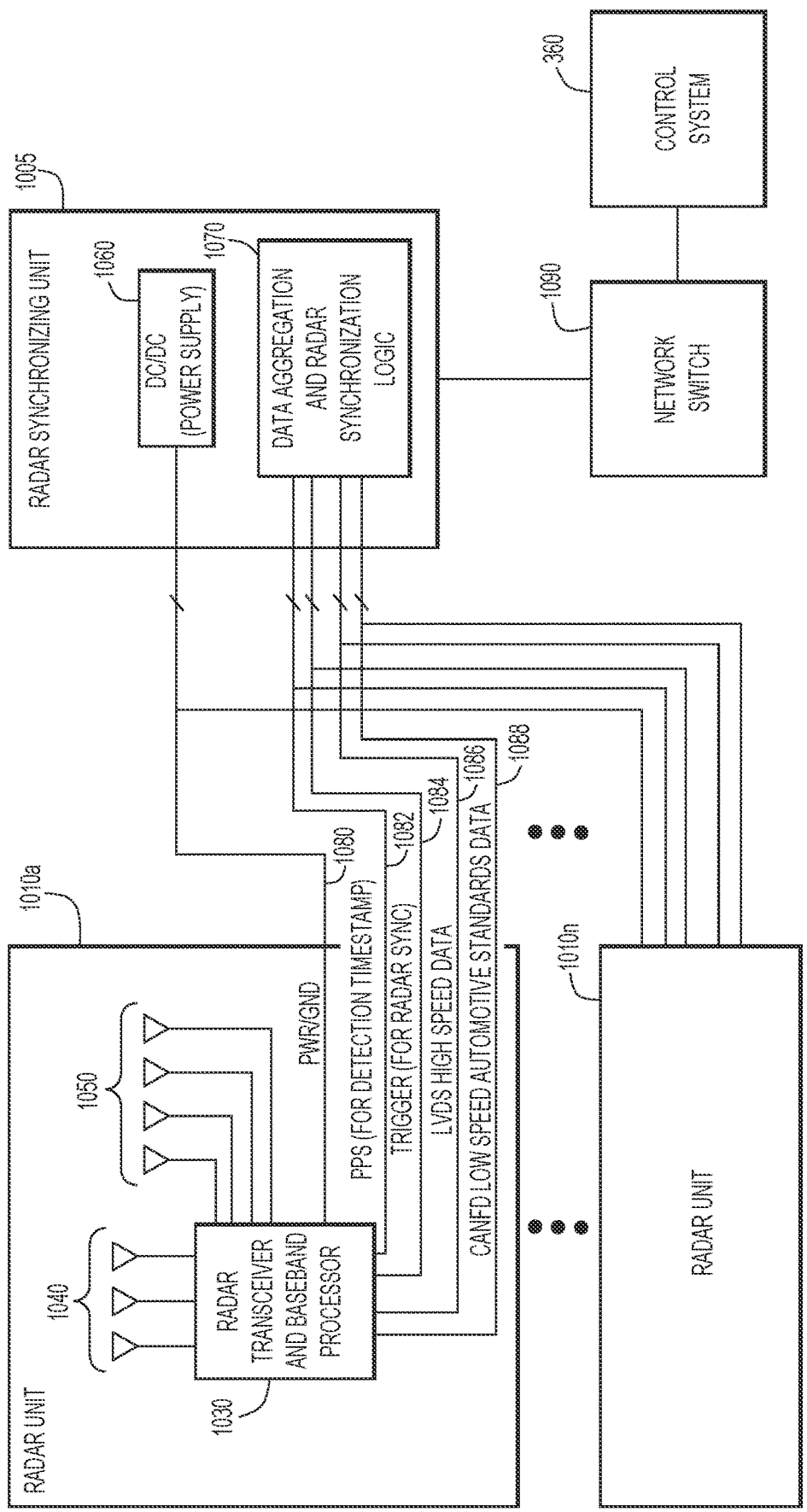
FIG. 10B is a more detailed block diagram representation of a radar system as depicted in FIG. 10A, that is connected to a control system of an autonomous vehicle, in accordance with an embodiment.

Referring now to FIG. 10B, a diagram is shown of the radar system 1000 in more detail, and coupled to a control system, according to an example embodiment. Each of the radar units 1010a-1010n may include a radar transceiver and baseband processor 1030 that is coupled to transmit antennas 1040 and to receive antennas 1050. In the configuration shown in FIG. 10B, the radar transceiver and baseband processor 1030 may include the power amplifier shown in FIG. 10A. The radar transceiver and baseband processor includes a radio frequency transmitter, a radio frequency receiver and a baseband processor recovers the desired information in the received radar signals for analysis by the radar synchronizing unit 1005.

The radar synchronizing unit 1005 includes a DC/DC power supply 1060 and data aggregation and radar synchronization logic 1070. The data aggregation and radar synchronization logic 1070 may be embodied by software executed by one or more processors or by digital logic gates in one or more Application Specific Integrated Circuits (ASICs) or Field Programmable Gate Arrays (FGPAs), or by a combination of software and hardware digital logic gates.

The DC/DC power supply 1060 is coupled, via line 1080, to each of the radar units 1010a-1010n to provide appropriate DC power to the radar units. In addition, there are several communication lines/paths between the data aggregation and radar synchronization logic 1070 and each of the radar units 1010a-1010n. Specifically, there is communication line 1082 that transports a timing interface, such as the Pulse Per Second (PPS) signal interface that is used for radar detection timestamping. The communication line 1084 carries a trigger signal to synchronization operation of a given radar unit with one or more other radar units. The communication line 1086 carries high-speed data from the radar transceiver and baseband processor 1030 to the data aggregation and radar synchronization logic 1070. For example, the high-speed data may be Low Voltage Differential Signaling (LVDS) data. LVDS, also known as TIA/EIA-644, is a technical standard that specifies electrical characteristics of differential serial signaling data. Finally, communication line 1088 carries low speed data, such as data in accordance with the Controller Area Network Flexible Data-Rate (CANFD) data-communication protocol. Each of the communication lines 1080-1088 may be one or more wires.

The data aggregation and radar synchronization logic 1070 controls the operation of the radar units 1010a-1010n and also aggregates the radar data obtained from the radar units 1010a-1010n for further analysis and use. To this end, the radar synchronizing unit 1005 is coupled, via a network switch 1090 to a control system, such as control system 360 (of FIG. 3) that manages autonomous operations of an autonomous vehicle.

Figure 11A:
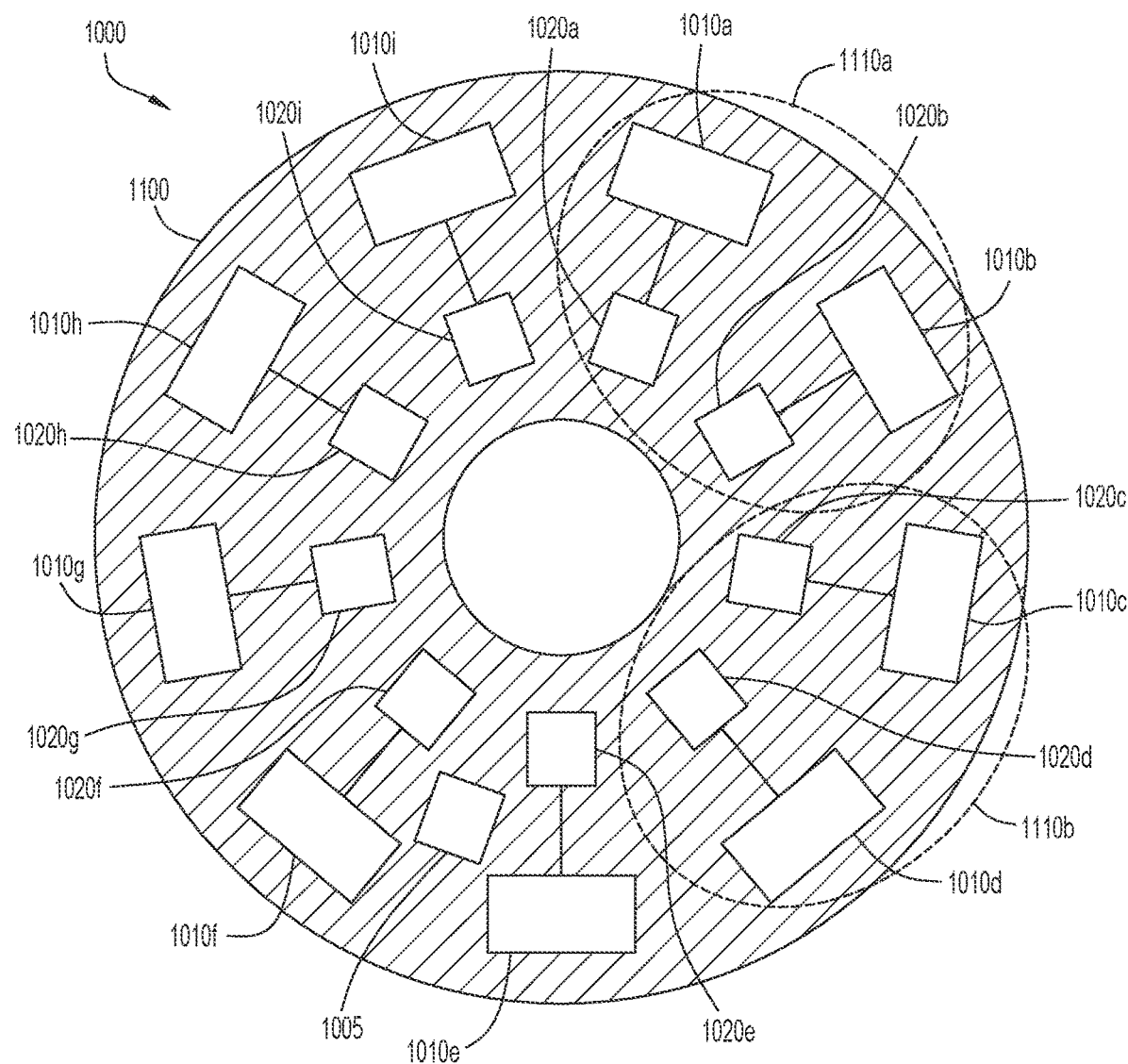
FIG. 11A is a diagrammatic cross-sectional top-view representation of a radar system e.g., radar system of FIG. 3, which includes substantially adjacent radar units configured to be synchronized in accordance with an embodiment.

Two or more adjacent radar units 1010a-n may be arranged to perform in synchronization (sync) as a substantially overall single or virtual radar unit to provide improved detection and/or radar imaging. FIG. 11A is a diagrammatic cross-sectional top-view representation of radar system 1000 in which substantially adjacent radar units 1010a-i may be configured to be synchronized or to operate substantially in sync in accordance with an embodiment. As shown, radar units 1010a-i and power amplifiers 1020a-i, as well as radar synchronizing unit 1005, are substantially mounted on a printed circuit board 1100.

As shown, adjacent radar units 1010a, 1010b may be configured to operate in sync, under control of the radar synchronizing unit 1005 (FIGS. 10A and 10B), such that radar units 1010a, 1010b effectively form a first overall or virtual radar unit 1110a. Similarly, adjacent radar units 1010c, 1010d may be configured to operate in sync as a second overall or virtual radar unit 1110b. Although two adjacent radar units are generally described as operating in sync, it should be appreciated that the number of adjacent radar units 1010a-i configured to operate in sync may vary widely, e.g., more than two adjacent radar units 1010a-i may be included in an overall radar unit.

Non-adjacent radar units may also be arranged to perform in sync as a substantially overall single radar unit. Radar units that are a larger distance apart may be arranged to perform in sync as an overall single radar unit to compare and/or to refine velocity and location information about an object or target that may be detected by radar units included in the overall single radar unit.

Figure 11B:
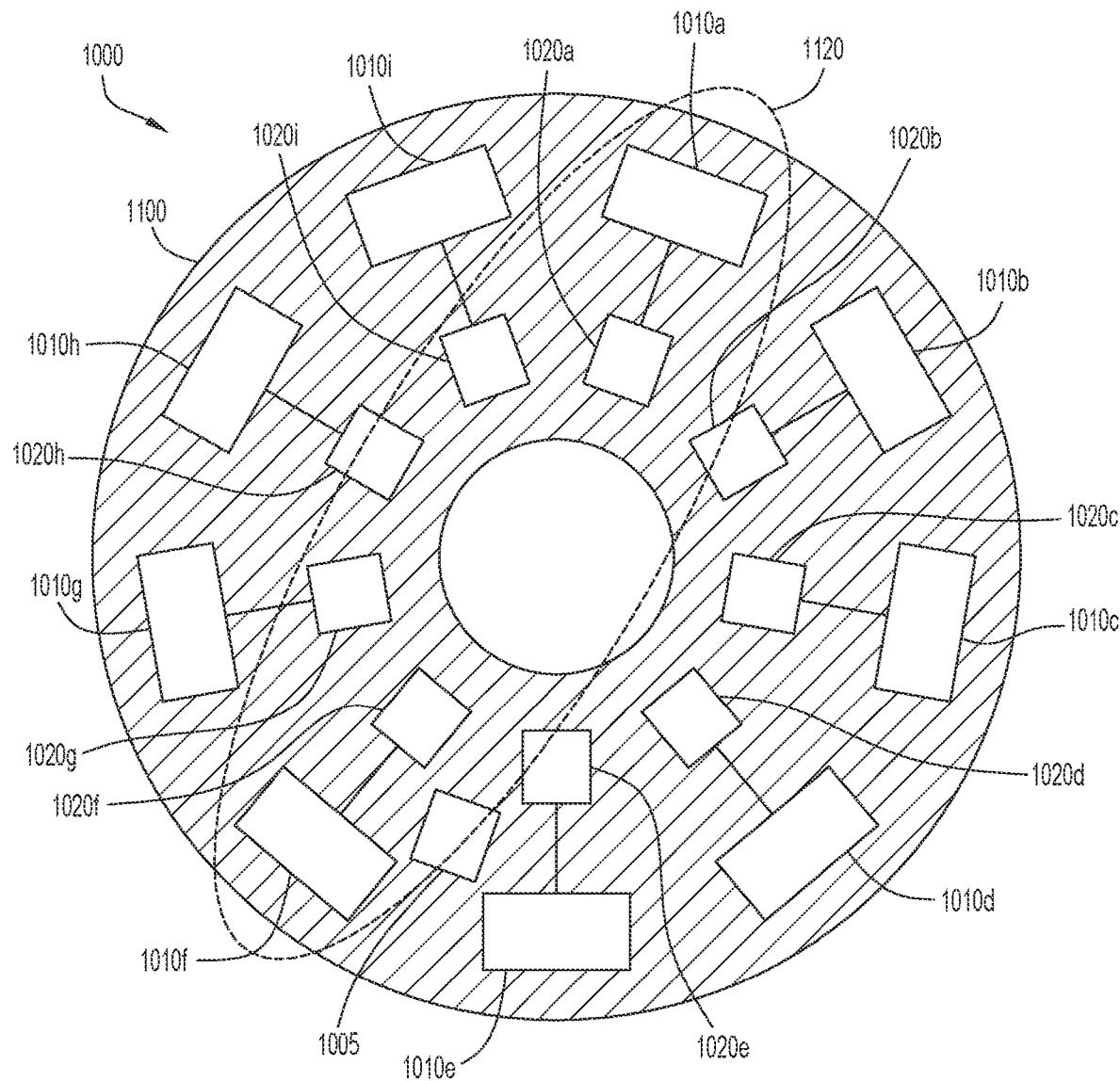
FIG. 11B is a diagrammatic cross-sectional top-view representation of a radar system e.g., radar system of FIG. 3, which includes substantially non-adjacent radar units configured to be synchronized in accordance with an embodiment.
Figure 11B:
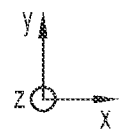

FIG. 11B is a diagrammatic cross-sectional top-view representation of radar system 1000, similar to FIG. 11A, but which includes substantially non-adjacent radar units 1010a-i configured to operate substantially in sync in accordance with an embodiment. As shown, non-adjacent radar units 1010a, 1010f may be configured to operate in sync such that radar units 1010a, 1010f effectively form an overall radar unit 1120. It should be appreciated that the number of non-adjacent radar units arranged to operate in sync may vary widely, e.g., more than two non-adjacent radar units may be included in an overall radar unit.

As described herein with reference to FIGS. 10A, 10B, 11A and 11B, the radar synchronizing unit 1005 can operate the entire array of individual radar units 1010a-1010i together, for a 360-degree field-of-view, and it can create one or more virtual radar units by effectively combining individual radar units, to get better resolvability in a particular direction/angular field-of-view less than 360 degrees. In addition, the radar synchronizing unit 1005 can group together two or more radar units, to form a virtual radar unit as depicted in FIGS. 11A and 11B, for some period of time and switch, for some other period of time, to operate all the radar units to obtain a 360-degree field-of-view. In other words, the radar synchronizing controller may be configured to switch between triggering operation of one or more groups of radar units as virtual radar units for less than the approximately 360-degree field-of-view for a first period of time, and triggering synchronized operation of the plurality of radar units for the approximately 360-degree field-of-view for a second period of time. Further still, the radar synchronizing unit 1005 can configure several groups of radar units to operate in sync to form multiple virtual radar units that collectively cover any angle range of view, including 360 degrees. In other words, the radar synchronizing controller may be configured to simultaneously trigger operation of one or more groups of radar units as virtual radar units for less than the approximately 360-degree field-of-view and trigger operation of the plurality of radar units for the approximately 360-degree field-of-view.

Figure 12:
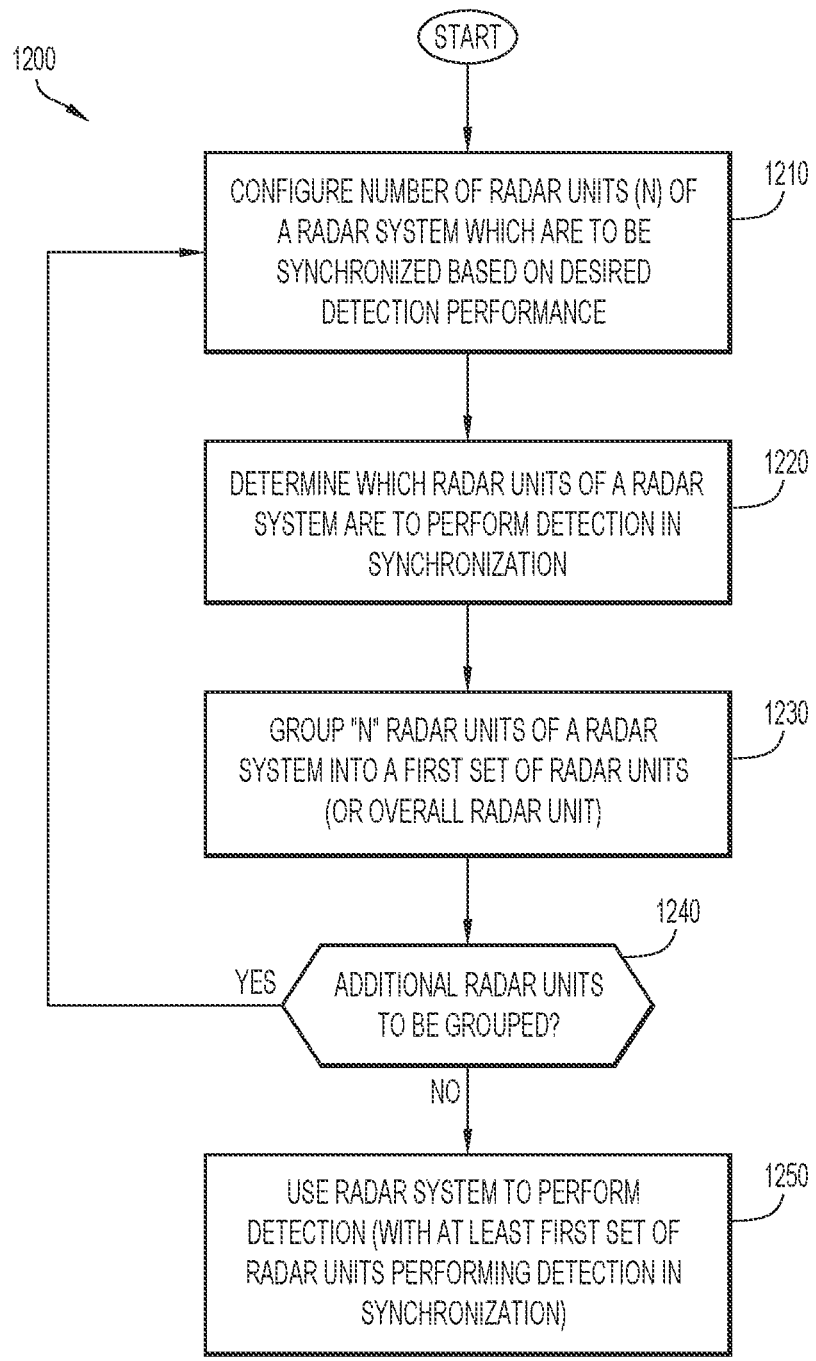
FIG. 12 is a process flow diagram which illustrates a method of synchronizing radar units of a radar system in accordance with an embodiment.

Referring next to FIG. 12, a method 1200 of synchronizing radar units of a radar system will be described in accordance with an embodiment. The method 1200 of synchronizing radar units of a radar system begins at a step 1210 in which a number of radar units "N" that are to be synchronized, or to operate substantially in sync, is configured. The number of radar units "N" to include in an overall radar unit may be determined or otherwise selected based on factors including, but not limited to including, a desired detection performance, desired field-of-view (a full 360-degree field-of-view or some lesser angular field-of-view), desired resolution, etc.

Once "N" is configured, the radar units which are to perform detection in synchronization are determined or otherwise identified in a step 1220. Identifying the radar units may include, but is not limited to including, determining which adjacent radar units to group together and/or which non-adjacent radar units to group together to form one or more overall or virtual radar units. Steps 1210 and 1220 could be performed at run-time.

In a step 1230, "N" radar units which are to operate substantially in sync are grouped together into a first set of radar units, or a first overall or virtual radar unit. After the first set of radar units is essentially created or otherwise identified, a determination is made in a step 1240 whether additional radar units are to be grouped. If it is determined that there is at least one other set of radar units or another overall/virtual radar unit to be created, then process flow returns to step 1210 in which a number of radar units to be synchronized is determined.

Alternatively, if it is determined in step 1240 that there are no additional radar units to be grouped, then in a step 1250, the radar system performs detection, or otherwise transmits signals in order to determine if there are objects or targets within an a field-of-view determined based on which and how many radar units are activated and synchronized, and up to a 360-degree field-of-view of the radar system. The radar system performs detection in the described embodiment with radar units or at least a first set of radar units operating substantially in sync. That is, the radar system performs detection with at least one set of radar units performing detection in synchronization. Upon the radar system performing detection, the method of synchronizing radar units of a radar system is completed.

There may be a situation in which the radar system reveals one or more objects at a particular angle while operating the radar units for a 360-degree field-of-view, and it is desired to take a more detailed second pass view of the one or more objects. To obtain a more focused and higher resolution view of the one or more objects of interest, the radar system may group together (and synchronize) two or more radar units that are oriented in a direction of interest and the resulting virtual radar unit can produce additional information and higher resolution radar image information in the direction of the one or more objects of interest. This decision and control capability is provided by the radar synchronizing unit described above in connection with FIGS. 10A, 10B, 11A and 11B.

Figure 13A:
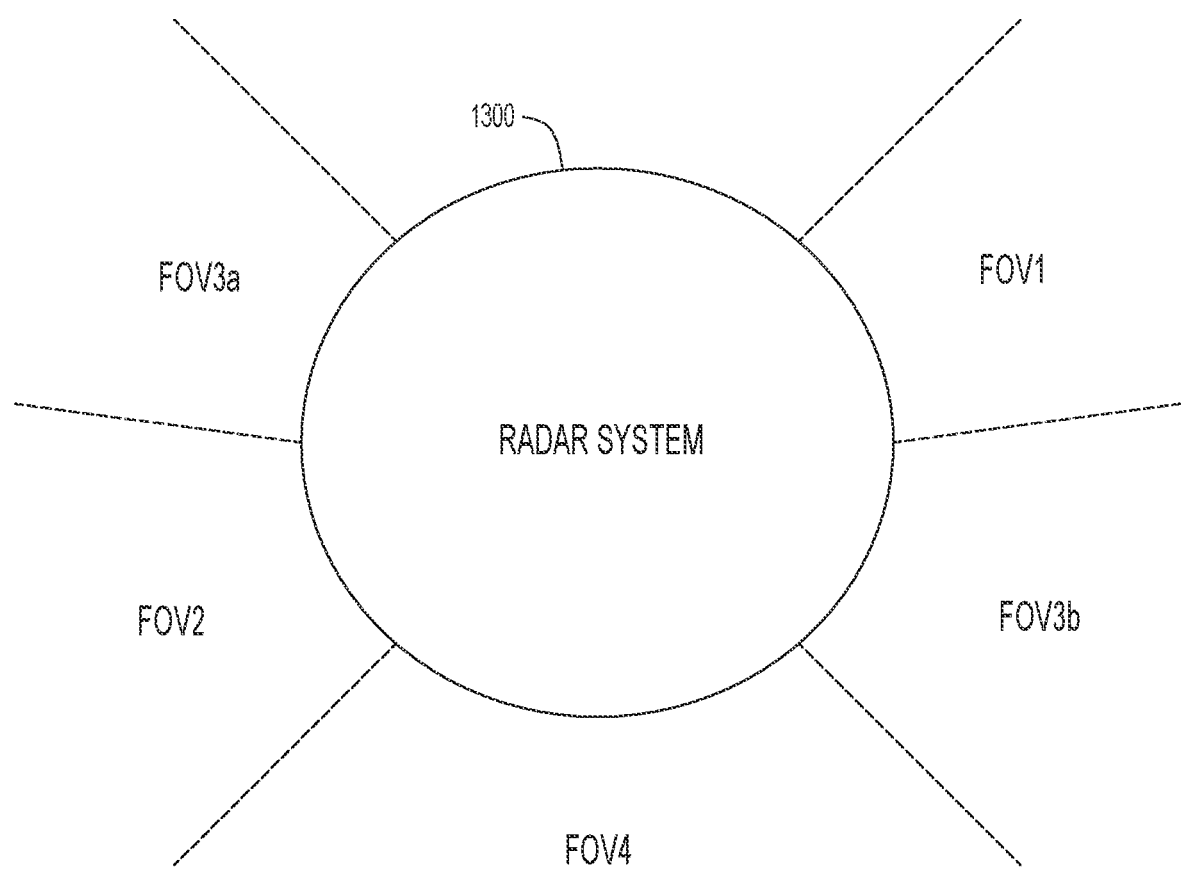
FIG. 13A is a diagram depicting different fields-of-view that may be achieved with a radar system using the techniques presented herein, in accordance with an embodiment.
Figure 13B:
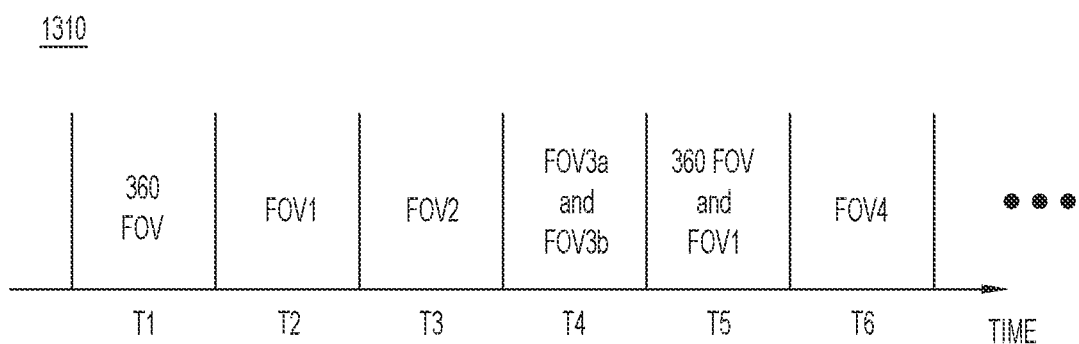
FIG. 13B is a timing diagram depicting the timing of selection of the different fields-of-view shown in FIG. 13A, in accordance with an embodiment.

To this end, reference is now made to FIGS. 13A and 13B, with continued reference to FIGS. 11A and 11B. FIG. 13A shows a radar module 1300 having a plurality of radar units positioned in a substantially circular arrangement to achieve a 360-degree field-of-view (FOV), as depicted in FIGS. 11A and 11B. Select two or more radar units may be grouped together and synchronously triggered to form different virtual radar units with different FOVs that are each less than the full 360-degree FOV. For example, a first FOV, denoted FOV1, may be formed by grouping two adjacent radar units, a second FOV, denoted FOV2, may be formed by grouping to adjacent radar units, a third FOV, denoted FOV3a/FOV2b may be formed by grouping two or more non-adjacent radar units, and a fourth FOV, denoted FOV4 may be formed by grouping three or four adjacent radar units. While FIG. 13A shows that the FOVs are non-overlapping, this is only by way of example and there may be situations when it is desired that the FOVs overlap.

FIG. 13B shows a timing diagram 1310 for an example of how the different FOVs may be activated during different time intervals. During a first time interval T1 all radar units are activated to capture a 360-degree FOV, followed by a second time interval T2 when the radar units for FOV1 are synchronously triggered then during a third time interval T3, the radar units for FOV2 are synchronously triggered. During a fourth time interval T4, the non-adjacent radar units for FOV3a and FOV3b are synchronously triggered. Then during time interval T5, all radar units for the 360-degree FOV are triggered as well as the two radar units for FOV1. Thus, during time interval T5, there is simultaneous triggering of (a) all of the radar units for the 360-degree FOV) and (b) a subset of the radar units (for FOV1). During time interval T6, the three or four radar units for FOV4 are synchronously triggered. Again, the timing diagram of FIG. 6 is only an example and is meant to illustrate how different FOV radar images may be captured at different time intervals or during the same interval.

Although only a few embodiments have been described in this disclosure, it should be understood that the disclosure may be embodied in many other specific forms without departing from the spirit or the scope of the present disclosure. By way of example, while a radar system has generally been described as including nine radar units arranged in a ring-like configuration, it should be appreciated that a radar system may generally include any number of radar units, e.g., fewer than or more than nine radar units. For instance, a radar system may include approximately ten radar units which are arranged in a ring-like configuration substantially within a housing.

In one embodiment, a radar system may include at least one inertial measurement unit (IMU). Such an IMU may be located on a board such as board 610 of FIG. 6 or printed circuit board 1100 of FIGS. 11A and 11B. As will be appreciated by those skilled in the art, an IMU may be used to provide information relating to a spatial orientation of sensors, e.g., radar units included in a radar system. For example, an IMU mounted in a radar module or system along with multiple radar units may facilitate the alignment of data obtained from the radar units with real world coordinates.

While power amplifiers have been described as being included in radar systems, some radar systems may not include power amplifiers. For example, radar units in a radar system may be used without power amplifiers. Alternatively, the transmission and/or detection ranges associated with each radar unit in a radar system may be improved using components other than power amplifiers.

As described above, within a radar system, substantially adjacent radar units may be grouped together into an overall radar unit or substantially non-adjacent radar units may be grouped together into an overall radar unit. It should be appreciated that in some embodiments, a radar system may include both overall radar units including adjacent radar units and overall radar units including non-adjacent radar units. In other embodiment, an overall radar unit may include both adjacent and non-adjacent radar units.

Figure 14:
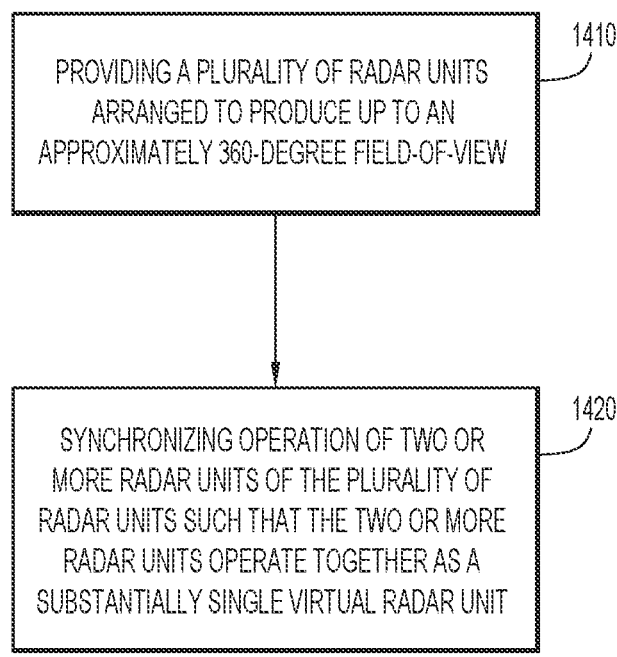
FIG. 14 is a flow chart of a method for triggering different fields-of-view of a radar system, according to an embodiment.

Turning now to FIG. 14, a simplified flow chart is shown of a radar imaging method 1400 according to an example embodiment. The method 1400 includes at step 1410, providing a plurality of radar units arranged to produce up to an approximately 360-degree field-of-view. At step 1420, the method 1400 includes synchronizing operation of two or more radar units of the plurality of radar units such that the two or more radar units operate together as a substantially single virtual radar unit.

An autonomous vehicle has generally been described as a land vehicle, or a vehicle that is arranged to be propelled or conveyed on land. It should be appreciated that in some embodiments, an autonomous vehicle may be configured for water travel, hover travel, and or/air travel without departing from the spirit or the scope of the present disclosure. In general, an autonomous vehicle may be any suitable transport apparatus that may operate in an unmanned, driverless, self-driving, self-directed, and/or computer-controlled manner.

The embodiments may be implemented as hardware, firmware, and/or software logic embodied in a tangible, i.e., non-transitory, medium that, when executed, is operable to perform the various methods and processes described above. That is, the logic may be embodied as physical arrangements, modules, or components. For example, the systems of an autonomous vehicle, as described above with respect to FIG. 3, may include hardware, firmware, and/or software embodied on a tangible medium. A tangible medium may be substantially any computer-readable medium that is capable of storing logic or computer program code which may be executed, e.g., by a processor or an overall computing system, to perform methods and functions associated with the embodiments. Such computer-readable mediums may include, but are not limited to including, physical storage and/or memory devices. Executable logic may include, but is not limited to including, code devices, computer program code, and/or executable computer commands or instructions.

It should be appreciated that a computer-readable medium, or a machine-readable medium, may include transitory embodiments and/or non-transitory embodiments, e.g., signals or signals embodied in carrier waves. That is, a computer-readable medium may be associated with non-transitory tangible media and transitory propagating signals.

Figure 15:
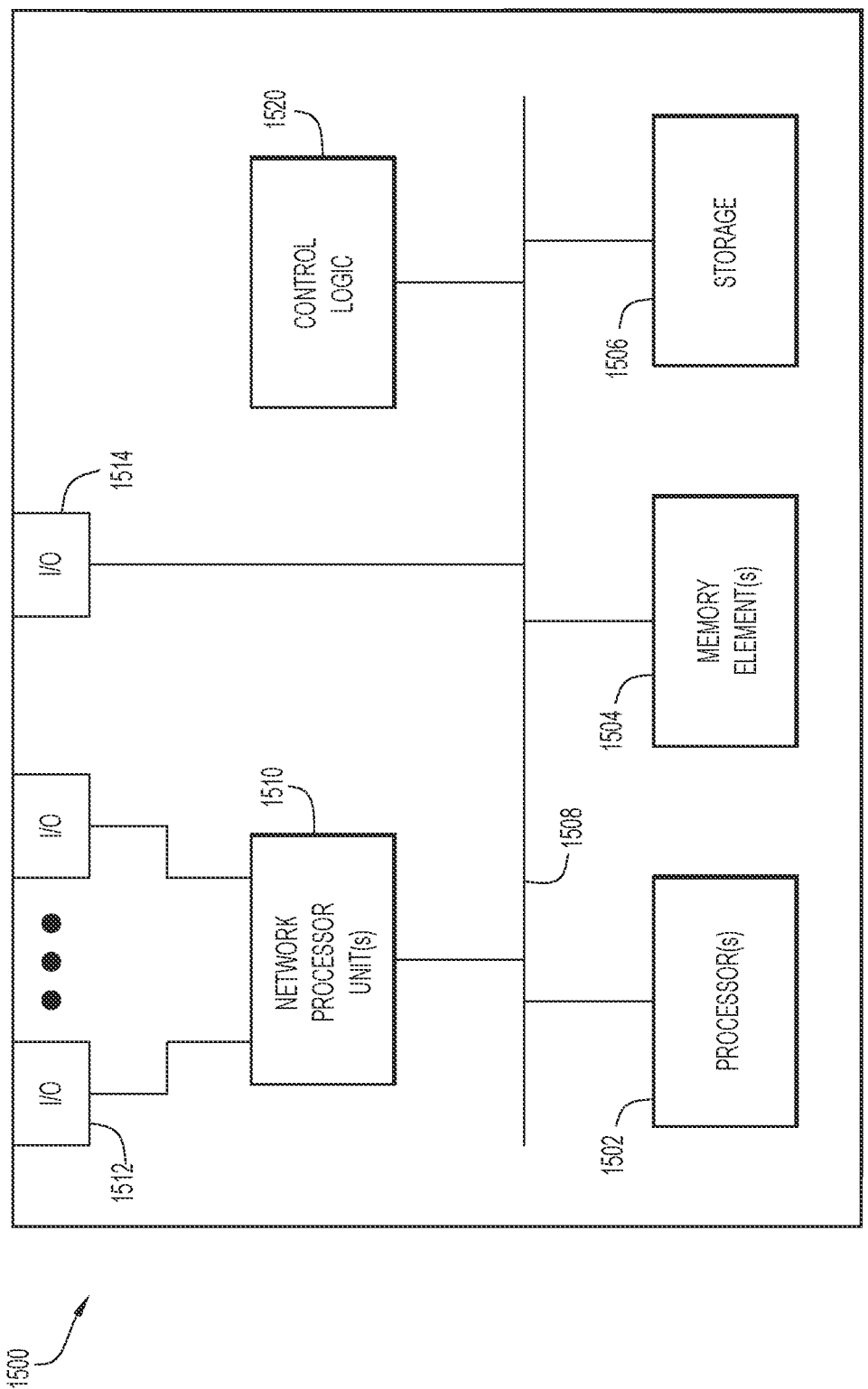
FIG. 15 is a block diagram of a computing device that may be configured to perform the radar synchronized control operations presented herein, according to an embodiment.

Referring to FIG. 15, FIG. 15 illustrates a hardware block diagram of a computing device 1500 that may perform functions associated with operations discussed herein in connection with the techniques depicted in FIGS. 1-14. In various embodiments, a computing device or apparatus, such as computing device 1500 or any combination of computing devices 1500, may be configured as any control devices, such as radar synchronizing unit 1005, as discussed for the techniques depicted in connection with FIGS. 1-14 in order to perform operations of the various techniques discussed herein.

In at least one embodiment, the computing device 1500 may be any apparatus that may include one or more processor(s) 1502, one or more memory element(s) 1504, storage 1506, a bus 1508, one or more network processor unit(s) 1510 interconnected with one or more network input/output (I/O) interface(s) 1512, one or more I/O interface(s) 1514, and control logic 1520. In various embodiments, instructions associated with logic for computing device 1500 can overlap in any manner and are not limited to the specific allocation of instructions and/or operations described herein.

In at least one embodiment, processor(s) 1502 is/are at least one hardware processor configured to execute various tasks, operations and/or functions for computing device 1500 as described herein according to software and/or instructions configured for computing device 1500. Processor(s) 1502 (e.g., a hardware processor) can execute any type of instructions associated with data to achieve the operations detailed herein. In one example, processor(s) 1502 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 1504 and/or storage 1506 is/are configured to store data, information, software, and/or instructions associated with computing device 1500, and/or logic configured for memory element(s) 1504 and/or storage 1506. For example, any logic described herein (e.g., control logic 1520) can, in various embodiments, be stored for computing device 1500 using any combination of memory element(s) 1504 and/or storage 1506. Note that in some embodiments, storage 1506 can be consolidated with memory element(s) 1504 (or vice versa), or can overlap/exist in any other suitable manner.

In at least one embodiment, bus 1508 can be configured as an interface that enables one or more elements of computing device 1500 to communicate in order to exchange information and/or data. Bus 1508 can be implemented with any architecture designed for passing control, data and/or information between processors, memory elements/storage, peripheral devices, and/or any other hardware and/or software components that may be configured for computing device 1500. In at least one embodiment, bus 1508 may be implemented as a fast kernel-hosted interconnect, potentially using shared memory between processes (e.g., logic), which can enable efficient communication paths between the processes.

In various embodiments, network processor unit(s) 1510 may enable communication between computing device 1500 and other systems, entities, etc., via network I/O interface(s) 1512 (wired and/or wireless) to facilitate operations discussed for various embodiments described herein. In various embodiments, network processor unit(s) 1510 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 1500 and other systems, entities, etc. to facilitate operations for various embodiments described herein. In various embodiments, network I/O interface(s) 1512 can be configured as one or more Ethernet port(s), Fibre Channel ports, any other I/O port(s), and/or antenna(s)/antenna array(s) now known or hereafter developed. Thus, the network processor unit(s) 1510 and/or network I/O interface(s) 1512 may include suitable interfaces for receiving, transmitting, and/or otherwise communicating data and/or information in a network environment.

I/O interface(s) 1514 allow for input and output of data and/or information with other entities that may be connected to computer device 1500. For example, I/O interface(s) 1514 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 1520 can include instructions that, when executed, cause processor(s) 1502 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 1520) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 1504 and/or storage 1506 can store data, software, code, instructions (e.g., processor instructions), logic, parameters, combinations thereof, and/or the like used for operations described herein. This includes memory element(s) 1504 and/or storage 1506 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer usable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

In summary, in one form, a radar system is provided comprising: a plurality of radar units arranged to provide up to an approximately 360-degree field-of-view; and a radar synchronizing controller coupled to the plurality of radar units and configured to substantially synchronously trigger operation of two or more radar units of the plurality of radar units such that the two or more radar units operate together as a substantially single virtual radar unit.

The radar synchronizing controller may be configured to trigger synchronized operation of two or more radar units, but less than the plurality of radar units, so that the two or more radar units operate together as a substantially single virtual radar unit having less than the 360-degree field-of-view.

The radar synchronizing controller may be configured to trigger operation of one or more of a plurality of groups, each group including two or more radar units of the plurality of radar units, such that the two or more radar units within a respective group operate substantially synchronously, and such that the plurality of groups operate as a plurality of individual virtual radar units.

The radar synchronizing controller may be further configured to determine which radar units to include in a particular group of the plurality of groups and to process data obtained by two or more radar units in the particular group in order to compare and/or to refine velocity and/or location information relating to a detected object.

The radar synchronizing controller may be configured to switch between triggering operation of one or more groups of radar units as virtual radar units for less than the approximately 360-degree field-of-view for a first period of time, and triggering synchronized operation of the plurality of radar units for the approximately 360-degree field-of-view for a second period of time.

The radar synchronizing controller may be configured to simultaneously trigger operation of one or more groups of radar units as virtual radar units for less than the approximately 360-degree field-of-view and trigger operation of the plurality of radar units for the approximately 360-degree field-of-view.

The plurality of radar units may be positioned in a substantially circular arrangement with antennas of respective radar units being positioned at substantially evenly spaced angles in the substantially circular arrangement. The two or more radar units within a respective group may be adjacent to each other in the substantially circular arrangement. The two or more radar units within a respective group may be adjacent to each other in the substantially circular arrangement.

The radar system may further include a substantially ring-shaped printed circuit board on which the plurality of radar units are mounted in circular arrangement, and also a sensor stack housing configured to contain the plurality of radar units, the sensor stack housing configured to be mounted on a vehicle.

In another form, a radar system is provided comprising: a plurality of radar units each including a transmitter, a receiver and at least one antenna, the plurality of radar units being arranged to provide up to an approximately 360-degree field-of-view; and a radar synchronizing controller coupled to the plurality of radar units and configured to trigger, at any given time interval, synchronized operation of the plurality of radar units so as to obtain radar data for the 360-degree field-of-view, or to trigger synchronized operation of two or more radar units, but less than the plurality of radar units, so that the two or more radar units operate together a substantially single virtual radar unit having less than the 360-degree field-of-view.

Again, the radar synchronizing controller may be configured to trigger operation of one or more of a plurality of groups, each group including two or more radar units of the plurality of radar units, such that the two or more radar units within a respective group operate substantially synchronously, and such that the plurality of groups operate as a plurality of individual virtual radar units.

The plurality of radar units may be positioned in a substantially circular arrangement with antennas of respective radar units being positioned at substantially evenly spaced angles in the substantially circular arrangement. The two or more radar units within a respective group are adjacent or non-adjacent to each other in the substantially circular arrangement.

In still another form, a method is provided comprising: providing a plurality of radar units arranged to produce up to an approximately 360-degree field-of-view; and synchronizing operation of two or more radar units of the plurality of radar units such that the two or more radar units operate together as a substantially single virtual radar unit.

Synchronizing may comprise triggering synchronized operation of two or more radar units, but less than the plurality of radar units, so that the two or more radar units operate together as a substantially single virtual radar unit having less than the 360-degree field-of-view.

Synchronizing may comprise triggering operation of one or more of a plurality of groups, each group including two or more radar units of the plurality of radar units, such that the two or more radar units within a respective group operate substantially synchronously, and such that the plurality of groups operate as a plurality of individual virtual radar units.

The method may further comprise determining which radar units to include in a particular group of the plurality of groups and to process data obtained by two or more radar units in the particular group in order to compare and/or to refine velocity and/or location information relating to a detected object.

The method may further comprise switching between triggering operation of one or more groups of radar units as virtual radar units for less than the approximately 360-degree field-of-view for a first period of time, and triggering synchronized operation of the plurality of radar units for the approximately 360-degree field-of-view for a second period of time.

Synchronizing may comprise simultaneously triggering operation of one or more groups of radar units as virtual radar units for less than the approximately 360-degree field-of-view and triggering operation of the plurality of radar units for the approximately 360-degree field-of-view.

The method may further include selecting the two or more radar units within a respective group such that the two or more radar units are adjacent to each other in a substantially circular arrangement with antennas of respective radar units being positioned at substantially evenly spaced angles in the substantially circular arrangement.

Likewise, the method may further include selecting the two or more radar units within a respective group such that the two or more radar units are non-adjacent to each other in a substantially circular arrangement with antennas of respective radar units being positioned at substantially evenly spaced angles in the substantially circular arrangement.

The steps associated with the methods of the present disclosure may vary widely. Steps may be added, removed, altered, combined, and reordered without departing from the spirit of the scope of the present disclosure. By way of example, a method of synchronizing radar units of a radar system may include determining, in substantially real time or at runtime while the radar units are in use, whether to configure a different number of radar units to operate in sync. Such a determination may be based on a perceived need for improved detection performance.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A radar system comprising:
   a set of radar units, the set of radar units including a first plurality of radar units and a second plurality of radar units, the first plurality of radar units arranged to provide up to an approximately 360-degree field-of-view; and
   a radar synchronizing controller coupled to the first plurality of radar units and configured to:
   substantially synchronously trigger operation of two or more radar units of the first plurality of radar units such that the two or more radar units operate together as a substantially single virtual radar unit; and
   determine a number of the second plurality of radar units to be synchronized and added to the first plurality of radar units based on one or more of a desired detection performance, a desired field-of-view, or a desired resolution.

2. The radar system of claim 1, wherein the radar synchronizing controller is configured to trigger synchronized operation of two or more radar units, but less than the first plurality of radar units, so that the two or more radar units operate together as a substantially single virtual radar unit having less than the approximately 360-degree field-of-view.

3. The radar system of claim 1, wherein the two or more radar units within a respective group operate substantially synchronously.

4. The radar system of claim 3, wherein the radar synchronizing controller is further configured to determine which radar units to include in a particular group and to process data obtained by two or more radar units in the particular group in order to compare and/or to refine velocity and/or location information relating to a detected object.

5. The radar system of claim 3, wherein the radar synchronizing controller is configured to switch between triggering operation of one or more groups of radar units as virtual radar units for less than the approximately 360-degree field-of-view for a first period of time, and triggering synchronized operation of the first plurality of radar units for the approximately 360-degree field-of-view for a second period of time.

6. The radar system of claim 3, wherein the radar synchronizing controller is configured to simultaneously trigger operation of one or more groups of radar units as virtual radar units for less than the approximately 360-degree field-of-view and trigger operation of the first plurality of radar units for the approximately 360-degree field-of-view.

7. The radar system of claim 3, wherein the first plurality of radar units are positioned at substantially evenly spaced angles in a substantially circular arrangement.

8. The radar system of claim 7, wherein the two or more radar units within a respective group are adjacent to each other in the substantially circular arrangement, and wherein the two or more radar units are associated with illumination patterns cooperating to provide up to the approximately 360-degree field-of-view.

9. The radar system of claim 7, wherein the two or more radar units within a respective group are non-adjacent to each other in the substantially circular arrangement, and wherein the two or more radar units are associated with illumination patterns cooperating to provide up to the approximately 360-degree field-of-view.

10. The radar system of claim 1, and further comprising a substantially ring-shaped printed circuit board on which the first plurality of radar units are mounted in a circular arrangement, the substantially ring-shaped printed circuit board having a circular central opening.

11. The radar system of claim 1, and further comprising a sensor stack housing configured to contain the first plurality of radar units, the sensor stack housing configured to be mounted on top of a vehicle and includes at least one sensor other than the radar system.

12. The radar system of claim 1, wherein the radar system is positioned on top of a vehicle.

13. A radar system comprising:
    a set of radar units, the set of radar units including a first plurality of radar units and a second plurality of radar units, the first plurality of radar units each including a transmitter, a receiver and at least one antenna, and the first plurality of radar units being arranged to provide up to an approximately 360-degree field-of-view; and
    a radar synchronizing controller coupled to the first plurality of radar units and configured to:
    trigger, at any given time interval, synchronized operation of the first plurality of radar units so as to obtain radar data for the approximately 360-degree field-of-view, or to trigger synchronized operation of two or more radar units, but less than the first plurality of radar units, so that the two or more radar units operate together a substantially single virtual radar unit having less than the approximately 360-degree field-of-view; and
    determine a number of the second plurality of radar units to be synchronized and added to the first plurality of radar units based on one or more of a desired detection performance, a desired field-of-view, or a desired resolution.

14. The radar system of claim 13, wherein the two or more radar units within a respective group operate substantially synchronously.

15. The radar system of claim 13, wherein the first plurality of radar units are positioned at substantially evenly spaced angles in a substantially circular arrangement.

16. The radar system of claim 15, wherein the two or more radar units within a respective group are adjacent or non-adjacent to each other in the substantially circular arrangement, and wherein the two or more radar units are associated with illumination patterns cooperating to provide up to the approximately 360-degree field-of-view.

17. A method comprising:
    providing a set of radar units, the set of radar units including a first plurality of radar units and a second plurality of radar units, the first plurality of radar units arranged to produce up to an approximately 360-degree field-of-view;
    synchronizing operation of two or more radar units of the first plurality of radar units such that the two or more radar units operate together as a substantially single virtual radar unit;

determining a number of the second plurality of radar units to be synchronized and added to the first plurality of radar units based on one or more of a desired detection performance, a desired field-of-view, or a desired resolution.

18. The method of claim 17, wherein synchronizing comprises triggering synchronized operation of two or more radar units, but less than the first plurality of radar units, so that the two or more radar units operate together as a substantially single virtual radar unit having less than the approximately 360-degree field-of-view.

19. The method of claim 17, wherein the two or more radar units within a respective group operate substantially synchronously.

20. The method of claim 19, further comprising:
determining which radar units to include in a particular group and to process data obtained by two or more radar units in the particular group in order to compare and/or to refine velocity and/or location information relating to a detected object.

21. The method of claim 19, further comprising:
switching between triggering operation of one or more groups of radar units as virtual radar units for less than the approximately 360-degree field-of-view for a first period of time, and triggering synchronized operation of the first plurality of radar units for the approximately 360-degree field-of-view for a second period of time.

22. The method of claim 19, wherein synchronizing comprises:
simultaneously triggering operation of one or more groups of radar units as virtual radar units for less than the approximately 360-degree field-of-view and triggering operation of the first plurality of radar units for the approximately 360-degree field-of-view.

23. The method of claim 19, further comprising:
selecting the two or more radar units within a respective group such that the two or more radar units are adjacent to each other positioned at substantially evenly spaced angles in a substantially circular arrangement, and wherein the two or more radar units are associated with illumination patterns cooperating to provide up to the approximately 360-degree field-of-view.

24. The method of claim 19, further comprising:
selecting the two or more radar units within a respective group such that the two or more radar units are non-adjacent to each other in a substantially circular arrangement with antennas of respective radar units being positioned at substantially evenly spaced angles in a substantially circular arrangement, and wherein the two or more radar units are associated with illumination patterns cooperating to provide up to the approximately 360-degree field-of-view.

* * * * *